(12) United States Patent
Nakatsuka et al.

(10) Patent No.: US 10,867,641 B2
(45) Date of Patent: Dec. 15, 2020

(54) DATA LATCH CIRCUIT AND SEMICONDUCTOR MEMORY DEVICE

(71) Applicant: Toshiba Memory Corporation, Tokyo (JP)

(72) Inventors: Keisuke Nakatsuka, Hyogo (JP); Tomoya Sanuki, Mie (JP); Takashi Maeda, Kanagawa (JP); Go Shikata, Ibaraki (JP); Hideaki Aochi, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/356,980

(22) Filed: Mar. 18, 2019

(65) Prior Publication Data

US 2020/0090710 A1    Mar. 19, 2020

(30) Foreign Application Priority Data

Sep. 14, 2018 (JP) .................................. 2018-172343
Mar. 12, 2019 (JP) .................................. 2019-044614

(51) Int. Cl.
| | |
|---|---|
| *G11C 7/10* | (2006.01) |
| *G11C 7/08* | (2006.01) |
| *H01L 27/11573* | (2017.01) |
| *G11C 16/26* | (2006.01) |
| *H01L 27/11529* | (2017.01) |
| *G11C 7/18* | (2006.01) |

(52) U.S. Cl.
CPC ............... *G11C 7/106* (2013.01); *G11C 7/08* (2013.01); *G11C 7/18* (2013.01); *G11C 16/26* (2013.01); *H01L 27/11529* (2013.01); *H01L 27/11573* (2013.01)

(58) Field of Classification Search
CPC .... H01L 27/11529; G11C 16/26; G11C 7/106
See application file for complete search history.

(56) References Cited

U.S. PATENT DOCUMENTS

| | | | |
|---|---|---|---|
| 4,800,300 | A | 1/1989 | Walters, Jr. |
| 5,774,410 | A | 6/1998 | Nakase |
| 7,460,099 | B2 | 12/2008 | Kubota et al. |
| 7,825,471 | B2 | 11/2010 | Asayama |
| 9,196,622 | B2 | 11/2015 | Morimoto |
| 2007/0252201 | A1 | 11/2007 | Kito |
| 2013/0003443 | A1 | 1/2013 | Houston |
| 2017/0271344 | A1 | 9/2017 | Morimoto |
| 2020/0051980 | A1* | 2/2020 | Liaw .............. H01L 21/823892 |

FOREIGN PATENT DOCUMENTS

| | | |
|---|---|---|
| EP | 0 315 301 A2 | 5/1989 |
| JP | 2007-266143 A | 10/2007 |
| TW | 311278 B | 7/1997 |

* cited by examiner

*Primary Examiner* — Hsien Ming Lee
(74) *Attorney, Agent, or Firm* — Foley & Lardner LLP

(57) ABSTRACT

A data latch circuit includes a first n-channel transistor and a first p-channel transistor. A gate of the first n-channel transistor and a gate of the first p-channel transistor are a common gate.

10 Claims, 16 Drawing Sheets

DATA LATCH CIRCUIT AND SEMICONDUCTOR MEMORY DEVICE

CROSS-REFERENCE TO RELATED APPLICATIONS

This application is based upon and claims the benefit of priority from Japanese Patent Application No. 2018-172343, filed on Sep. 14, 2018, and Japanese Patent Application No. 2019-044614, filed on Mar. 12, 2019; the entire contents of which are incorporated herein by reference.

FIELD

Embodiments relate to a data latch circuit and semiconductor memory device.

BACKGROUND

In recent years, sense amplifiers are used in a semiconductor memory device including NAND flash memory to read the data stored in the memory cells. When the integration of the memory cells is increased, the number of data latch circuits connected to each sense amplifier is increased to maintain the data transfer rate; and the surface area of the entirety undesirably increases.

BRIEF DESCRIPTION OF THE DRAWINGS

FIG. 11A shows the semiconductor regions, the gates, and the contacts; FIG. 11B shows the first interconnect layer in addition to FIG. 11A; and FIG. 11C shows the second interconnect layer and the third interconnect layer in addition to FIG. 11B;

DETAILED DESCRIPTION

A data latch circuit includes a first n-channel transistor and a first p-channel transistor. A gate of the first n-channel transistor and a gate of the first p-channel transistor are a common gate.

A semiconductor memory device includes a sense amplifier, the data latch circuit, a plurality of electrode films stacked to be separated from each other, a semiconductor member piercing the plurality of electrode films, a charge storage member provided between the semiconductor member and the electrode films, a source line connected to the semiconductor member, and a bit line connected between the semiconductor member and the sense amplifier.

First Embodiment

A first embodiment will now be described.

Figure 1:
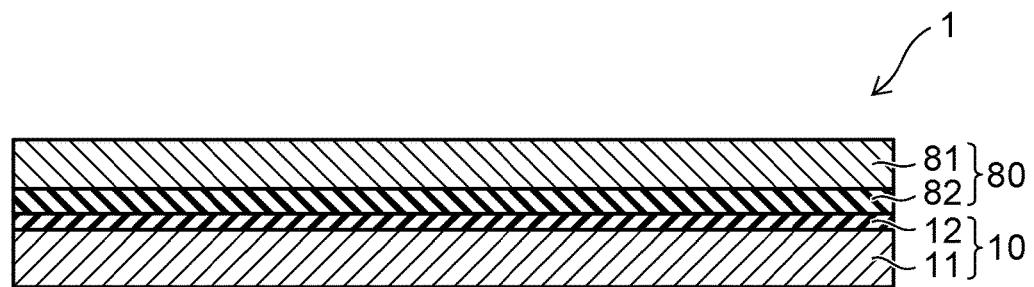
FIG. 1 is a cross-sectional view showing a semiconductor memory device according to a first embodiment.

FIG. 1 is a cross-sectional view showing a semiconductor memory device according to the embodiment.

Figure 2:
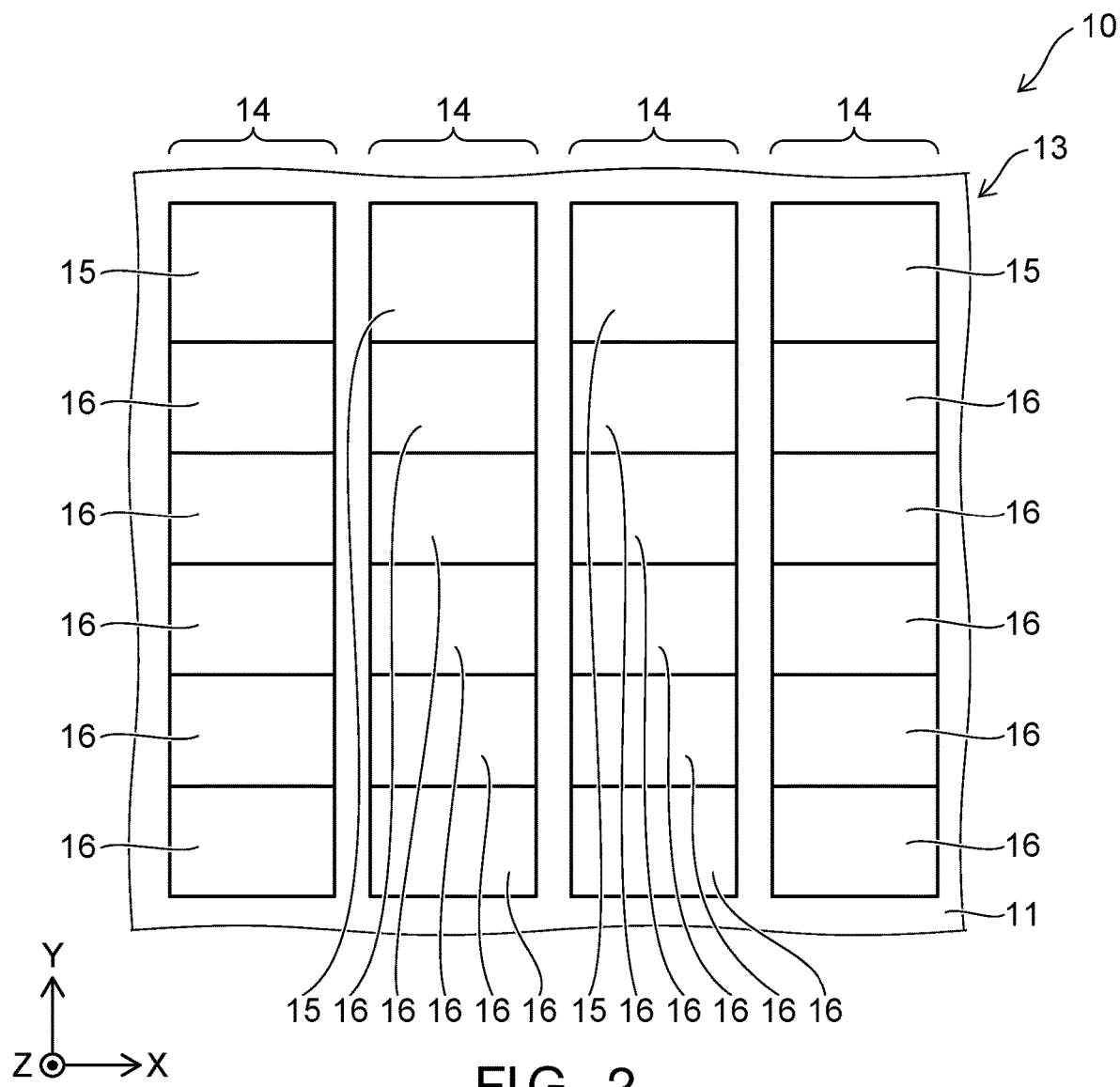
FIG. 2 is a plan view showing sense amplifier circuits of the semiconductor memory device according to the first embodiment.

FIG. 2 is a plan view showing sense amplifier circuits of the semiconductor memory device according to the embodiment.

Figure 3:
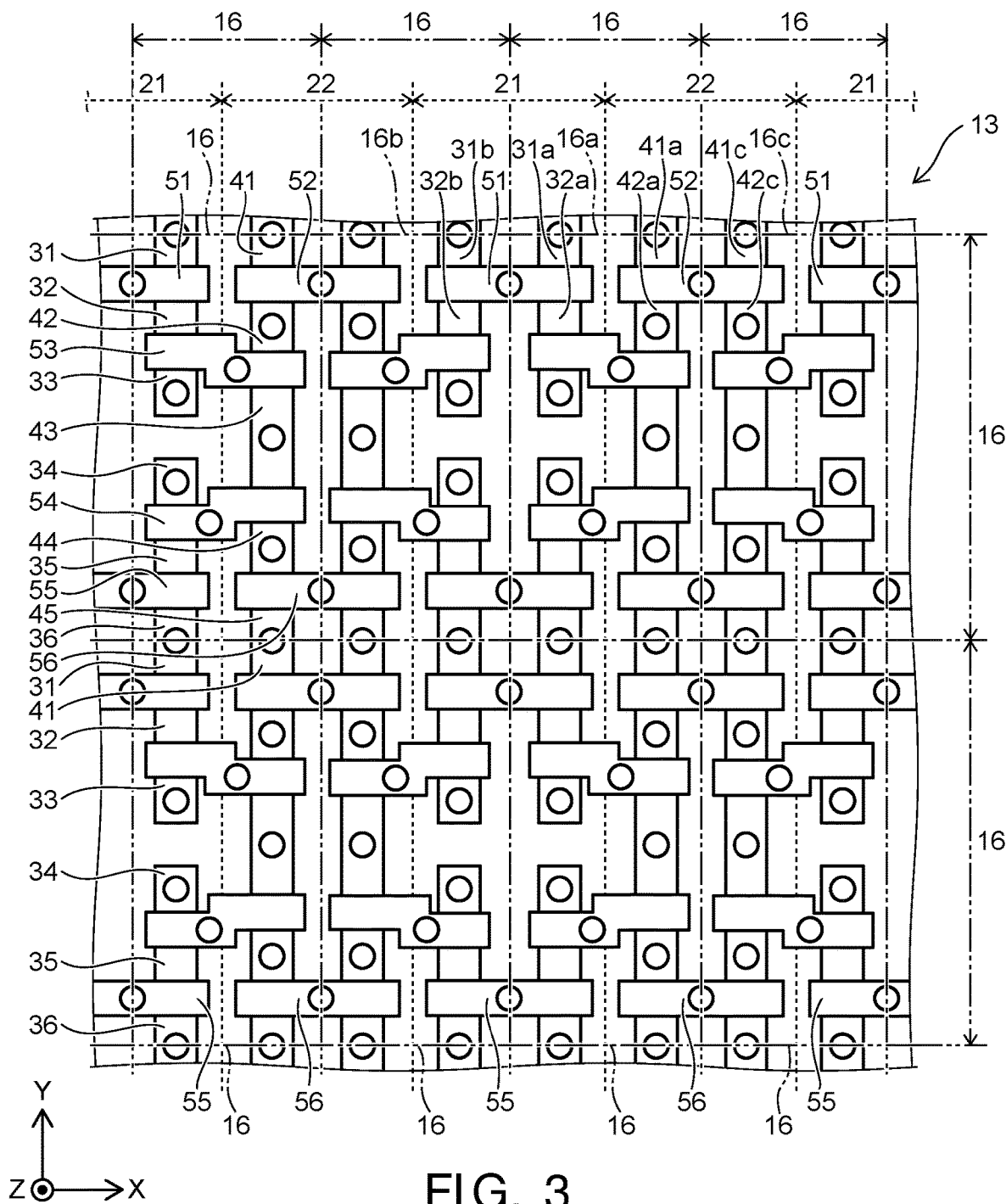
FIG. 3 is a plan view showing data latch circuits according to the first embodiment.

FIG. 3 is a plan view showing data latch circuits according to the embodiment.

Figure 4A:
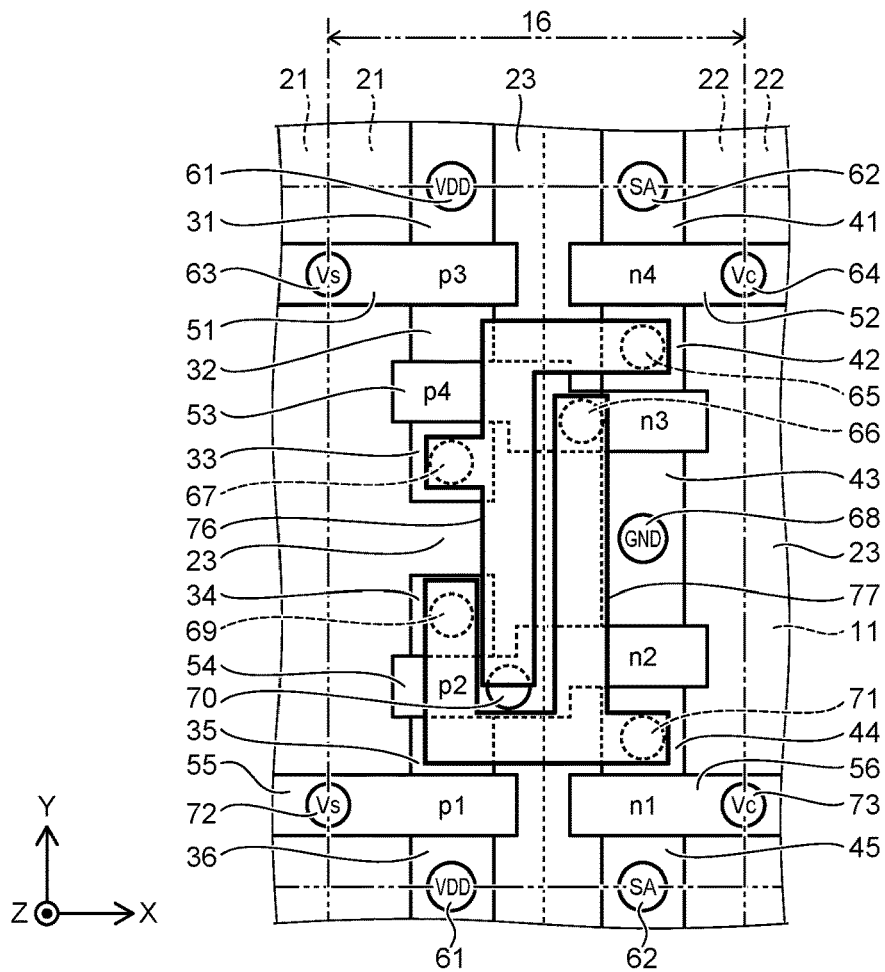
FIG. 4A is a plan view showing one data latch circuit.
Figure 4B:
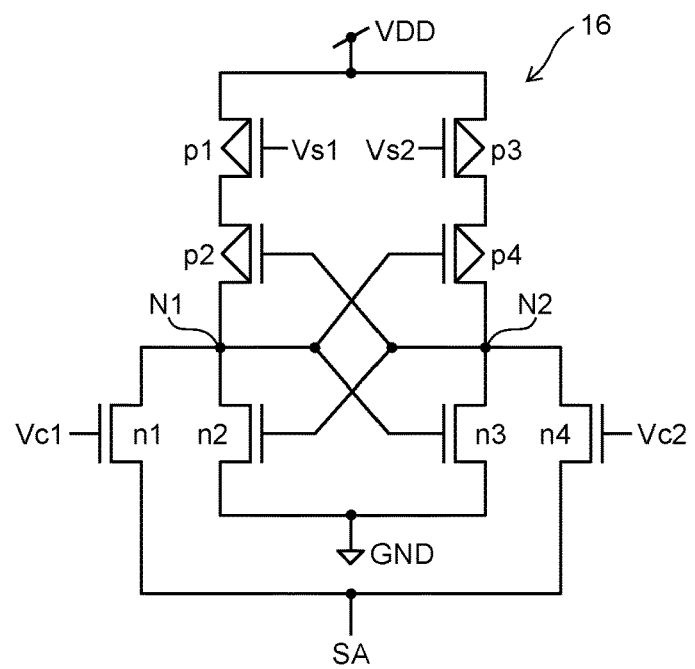
FIG. 4B is a circuit diagram of the one data latch circuit.

FIG. 4A is a plan view showing one data latch circuit; and FIG. 4B is a circuit diagram of the one data latch circuit.

Figure 5:
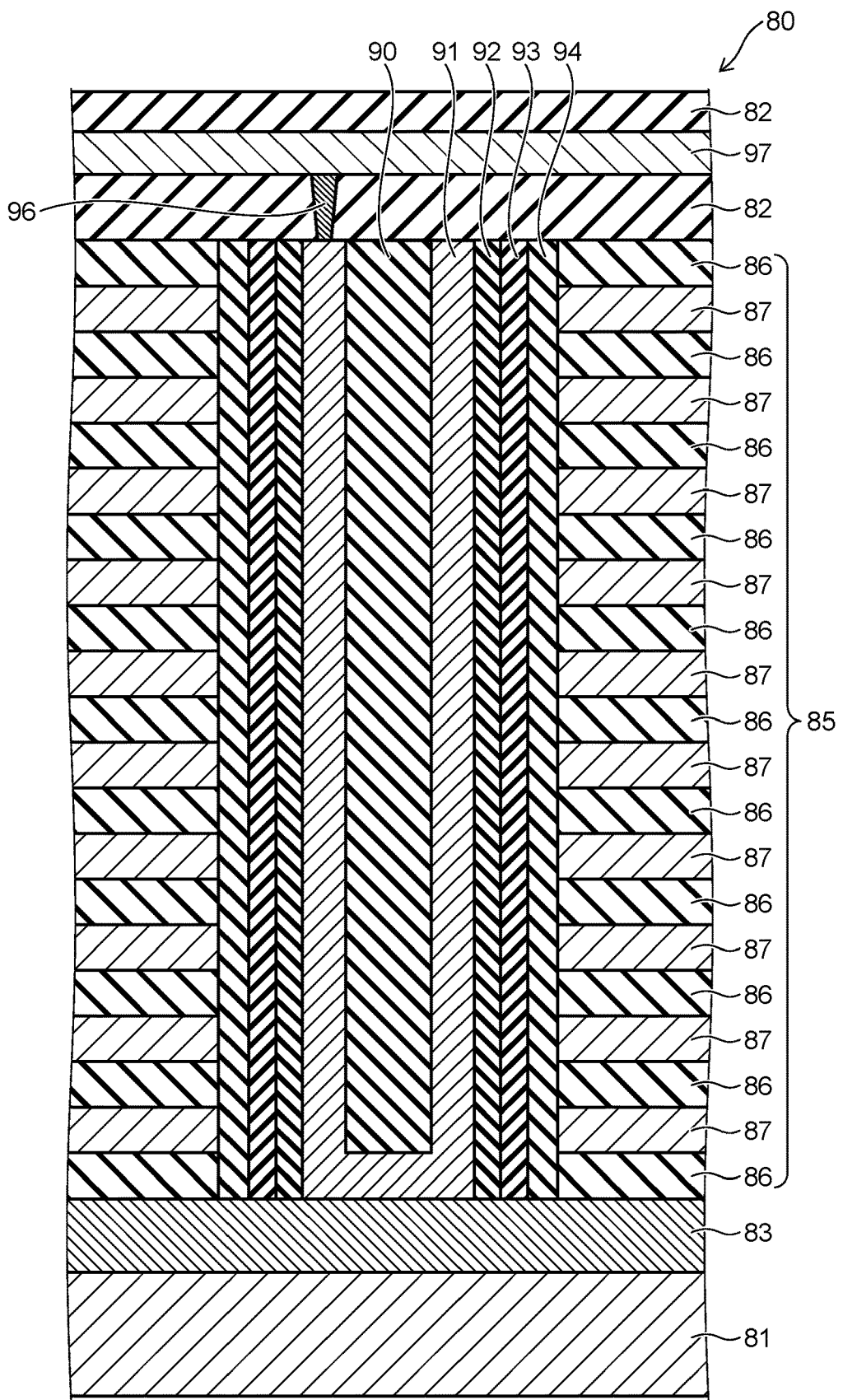
FIG. 5 is a cross-sectional view showing memory cells of the semiconductor memory device according to the first embodiment.

FIG. 5 is a cross-sectional view showing memory cells of the semiconductor memory device according to the embodiment.

The drawings are schematic; and components are not illustrated or enhanced as appropriate. The numbers and the dimensional ratios of the components do not always match between the drawings.

As shown in FIG. 1, a control circuit substrate 10 and a memory array substrate 80 are provided in the semiconductor memory device 1 according to the embodiment. A silicon substrate 11 and an inter-layer insulating film 12 are stacked in the control circuit substrate 10; and a silicon substrate 81 and an inter-layer insulating film 82 are stacked in the memory array substrate 80. The control circuit substrate 10 and the memory array substrate 80 are bonded so that the inter-layer insulating film 12 and the inter-layer insulating film 82 oppose each other.

First, the control circuit substrate 10 will be described.

In the control circuit substrate 10 as shown in FIG. 2, a control circuit is formed inside the inter-layer insulating film 12 and the upper layer portion of the silicon substrate 11 (referring to FIG. 1). A sense amplifier region 13 is set in the control circuit; and multiple sense amplifier circuits 14 are provided in the sense amplifier region 13. One sense amplifier 15 and multiple, e.g., five data latch circuits 16 are arranged in one column in each of the sense amplifier circuits 14. The sense amplifier 15 sequentially detects an electrical signal transmitted from the memory array substrate 80 as binary data. The data latch circuits 16 temporarily hold the data detected by the sense amplifier 15. The inter-layer insulating film 12 is not illustrated for convenience of illustration in FIG. 2, FIG. 3, and FIG. 4A.

Hereinbelow, an XYZ orthogonal coordinate system is employed for convenience of description of the control circuit substrate 10. The direction in which the multiple sense amplifier circuits 14 are arranged is taken as an "X-direction;" the direction in which the sense amplifier 15 and the data latch circuits 16 are arranged in each of the sense amplifier circuits 14 is taken as a "Y-direction;" and a direction orthogonal to both the X-direction and the Y-direction is taken as a "Z-direction." Although a direction that is in the Z-direction from the silicon substrate 11 toward the inter-layer insulating film 12 also is called "up," and the reverse direction also is called "down," these expressions are for convenience and are independent of the direction of gravity.

As shown in FIG. 2 and FIG. 3, the multiple data latch circuits 16 are arranged in a matrix configuration along the X-direction and the Y-direction in the sense amplifier region 13. The multiple data latch circuits 16 that are arranged along the Y-direction belong to the same sense amplifier circuit 14; and the multiple data latch circuits 16 that are arranged along the X-direction belong to different sense amplifier circuits 14. The layouts of the multiple data latch circuits 16 arranged along the Y-direction are the same. On the other hand, the layouts of the data latch circuits 16 adjacent to each other in the X-direction are mirror images of each other.

On the silicon substrate 11 as shown in FIG. 4A, an n-well 21 that has an n-conductivity type is multiply provided; and a p-well 22 that is of a p-conductivity type is multiply provided. The n-wells 21 and the p-wells 22 are arranged alternately along the X-direction. The n-wells 21 and the p-wells 22 extend in the Y-direction and are disposed over all of the data latch circuits 16 arranged along the Y-direction. Each of the data latch circuits 16 is formed by straddling one n-well 21 and one p-well 22 adjacent to each other in the X-direction. One data latch circuit 16 shares one n-well 21 with another data latch circuit 16 disposed on one X-direction side; and the one data latch circuit 16 shares the p-well 22 with another data latch circuit 16 disposed on the other X-direction side.

The configuration of each of the data latch circuits 16 will now be described.

As shown in FIG. 3 and FIG. 4A, p-type layers 31 to 36 that are of the p-conductivity type are provided on the n-well 21 in each of the data latch circuits 16. The p-type layers 31 to 36 are separated from each other and are arranged in one column in this order along the Y-direction. The p-type layer 36 and the p-type layer 31 are continuous between the data latch circuits 16 adjacent to each other in the Y-direction. Portions of the n-well 21 are interposed respectively between the p-type layer 31 and the p-type layer 32, between the p-type layer 32 and the p-type layer 33, between the p-type layer 34 and the p-type layer 35, and between the p-type layer 35 and the p-type layer 36. On the other hand, a STI (Shallow Trench Isolation (element-separating insulating film)) 23 is provided between the p-type layer 33 and the p-type layer 34.

Thereby, the p-type layers 34, 35, and 36 of one data latch circuit 16 of two data latch circuits 16 adjacent to each other in the Y-direction and the p-type layers 31, 32, and 33 of the other data latch circuit 16 of the two data latch circuits 16 form one semiconductor region (active area) having an island configuration with the n-well 21 interposed between these p-type layers. However, at the two end portions of the column made of the multiple data latch circuits 16 included in each of the sense amplifier circuits 14, the p-type layers 31 to 33 form an island-shaped semiconductor region or the p-type layers 34 to 36 form an island-shaped semiconductor region.

Also, in each of the data latch circuits 16, n-type layers 41 to 45 that have the n-conductivity type are provided on the p-well 22. The n-type layers 41 to 45 are separated from each other and arranged in one column in this order along the Y-direction. The n-type layer 45 and the n-type layer 41 are continuous between the data latch circuits 16 adjacent to each other in the Y-direction. Portions of the p-well 22 are interposed respectively between the n-type layer 41 and the n-type layer 42, between the n-type layer 42 and the n-type layer 43, between the n-type layer 43 and the n-type layer 44, and between the n-type layer 44 and the n-type layer 45.

Thereby, on each of the p-wells 22, the multiple sets of the n-type layers 41 to 45 arranged along the Y-direction form one semiconductor region (active area) having a line configuration with the p-well 22 interposed between these n-type layers.

In the sense amplifier region 13, the STI 23 is disposed between the multiple island-shaped semiconductor regions formed of the p-type layers 34 to 36, the p-type layers 31 to 33, and the n-well 21 interposed between these p-type layers and between the multiple line-shaped semiconductor regions formed of the n-type layers 41 to 45 and the p-well 22 interposed between these n-type layers.

Gates 51 to 56 are provided in each of the data latch circuits 16. The gates 51 to 56 extend in substantially the X-direction and cross the semiconductor regions described above. Gate insulating films (not illustrated) are provided between the gates 51 to 56 and the semiconductor regions. The positional relationship between the gates 51 to 56, the p-type layers 31 to 36, and the n-type layers 41 to 45 will now be described.

As shown in FIG. 3, the gate 51 is disposed to cross the region directly above the portion of the n-well 21 between the p-type layer 31 and the p-type layer 32. In the data latch circuits 16 adjacent to each other in the X-direction, the gate 51 is a common gate. In other words, in each of two data latch circuits 16 adjacent to each other in the X-direction and having layouts that are mirror images of each other, one gate 51 that extends in the X-direction is disposed in the regions directly above the portions of the n-well 21 between the p-type layers 31 and the p-type layers 32. Specifically, among the multiple data latch circuits 16, when two data latch circuits 16 adjacent to each other in the X-direction and sharing the n-well 21 are taken as a "data latch circuit 16a" and a "data latch circuit 16b," a p-type layer 31a and a p-type layer 32a that belong to the data latch circuit 16a share one gate 51 with a p-type layer 31b and a p-type layer 32b belonging to the data latch circuit 16b.

The gate 52 is disposed to cross the region directly above the portion of the p-well 22 between the n-type layer 41 and the n-type layer 42. In the data latch circuits 16 adjacent to each other in the X-direction, the gate 52 is a common gate. In other words, in each of two data latch circuits 16 adjacent to each other in the X-direction and having layouts that are mirror images of each other, one gate 52 that extends in the X-direction is disposed in the regions directly above the portions of the p-well 22 between the n-type layers 41 and the n-type layers 42. Specifically, among the multiple data latch circuits 16, when two data latch circuits 16 adjacent to each other in the X-direction and sharing the p-well 22 are taken as a "data latch circuit 16a" and a "data latch circuit 16c," an n-type layer 41a and an n-type layer 42a that belong to the data latch circuit 16a share one gate 52 with an n-type layer 41c and an n-type layer 42c belonging to the data latch circuit 16c.

The combination is different between the two data latch circuits 16 sharing the gate 51 and the two data latch circuits 16 sharing the gate 52. As described above, one data latch circuit 16a shares the gate 51 with the data latch circuit 16b on one X-direction side and shares the gate 52 with the data latch circuit 16c on the other X-direction side. In the entire sense amplifier region 13, the gate 51 and the gate 52 are arranged alternately along the X-direction and are separated from each other.

The gate 53 is disposed to cross the region directly above the portion of the n-well 21 between the p-type layer 32 and the p-type layer 33 and the region directly above the portion of the p-well 22 between the n-type layer 42 and the n-type layer 43. For example, the gate 53 has a crank-like configuration when viewed from the Z-direction.

The gate 54 is disposed to cross the region directly above the portion of the n-well 21 between the p-type layer 34 and the p-type layer 35 and the region directly above the portion of the p-well 22 between the n-type layer 43 and the n-type layer 44. For example, the gate 54 has a crank-like configuration when viewed from the Z-direction.

The gate 55 is disposed to cross the region directly above the portion of the n-well 21 between the p-type layer 35 and the p-type layer 36. In the data latch circuits 16 adjacent to each other in the X-direction, the gate 55 is a common gate. In other words, in the example described above, the gate 55 is a common gate between the data latch circuit 16a and the data latch circuit 16b.

The gate 56 is disposed to cross the region directly above the portion of the p-well 22 between the n-type layer 44 and the n-type layer 45. In the data latch circuits 16 adjacent to each other in the X-direction, the gate 56 is a common gate. In other words, in the example described above, the gate 56 is a common gate between the data latch circuit 16a and the data latch circuit 16c.

Similarly to the relationship between the gate 51 and the gate 52 described above, the combination is different between the two data latch circuits 16 sharing the gate 55 and the two data latch circuits 16 sharing the gate 56. As described above, one data latch circuit 16a shares the gate 55 with the data latch circuit 16b on one X-direction side and shares the gate 56 with the data latch circuit 16c on the other X-direction side. In the entire sense amplifier region 13, the gate 55 and the gate 56 are arranged alternately along the X-direction and are separated from each other.

Thereby, four p-channel transistors p1 to p4 and four n-channel transistors n1 to n4 are formed in each of the data latch circuits 16.

More specifically, the p-channel transistor p3 is formed of the p-type layer 31, the p-type layer 32, the portion of the n-well 21 between the p-type layer 31 and the p-type layer 32, and the gate 51. The p-channel transistor p4 is formed of the p-type layer 32, the p-type layer 33, the portion of the n-well 21 between the p-type layer 32 and the p-type layer 33, and the gate 53. The p-channel transistor p2 is formed of the p-type layer 34, the p-type layer 35, the portion of the n-well 21 between the p-type layer 34 and the p-type layer 35, and the gate 54. The p-channel transistor p1 is formed of the p-type layer 35, the p-type layer 36, the portion of the n-well 21 between the p-type layer 35 and the p-type layer 36, and the gate 55.

The n-channel transistor n4 is formed of the n-type layer 41, the n-type layer 42, the portion of the p-well 22 between the n-type layer 41 and the n-type layer 42, and the gate 52. The n-channel transistor n3 is formed of the n-type layer 42, the n-type layer 43, the portion of the p-well 22 between the n-type layer 42 and the n-type layer 43, and the gate 53. The n-channel transistor n2 is formed of the n-type layer 43, the n-type layer 44, the portion of the p-well 22 between the n-type layer 43 and the n-type layer 44, and the gate 54. The n-channel transistor n1 is formed of the n-type layer 44, the n-type layer 45, the portion of the p-well 22 between the n-type layer 44 and the n-type layer 45, and the gate 56.

Thus, the p-channel transistor p4 and the n-channel transistor n3 share one gate 53. The p-channel transistor p2 and the n-channel transistor n2 also share one gate 54.

Contacts 61 to 73 are provided in each of the data latch circuits 16.

The lower end of the contact 61 is connected to the p-type layer 31 and the p-type layer 36. The lower end of the contact 62 is connected to the n-type layer 41 and the n-type layer 45. The contacts 61 and 62 are shared by two data latch circuits 16 adjacent to each other in the Y-direction. The lower end of the contact 63 is connected to the gate 51. Similarly to the gate 51, the contact 63 is shared by two data latch circuits 16 adjacent to each other in the X-direction. The contact 64 is connected to the lower end of the gate 52. Similarly to the gate 52, the contact 64 is shared by two data latch circuits 16 adjacent to each other in the X-direction.

The lower end of the contact 65 is connected to the n-type layer 42. The lower end of the contact 66 is connected to the gate 53. The lower end of the contact 67 is connected to the p-type layer 33. The lower end of the contact 68 is connected to the n-type layer 43. The lower end of the contact 69 is connected to the p-type layer 34. The lower end of the contact 70 is connected to the gate 54. The lower end of the contact 71 is connected to the n-type layer 44.

The lower end of the contact 72 is connected to the gate 55. Similarly to the gate 55, the contact 72 is shared by two data latch circuits 16 adjacent to each other in the X-direction. The lower end of the contact 73 is connected to the gate 56. Similarly to the gate 56, the contact 73 is shared by two data latch circuits 16 adjacent to each other in the X-direction.

Interconnects 76 and 77 are provided in each of the data latch circuits 16.

As shown in FIG. 4A, the interconnect 76 is connected to the upper end of the contact 70 and to the upper end of the contact 67 and the upper end of the contact 65 disposed higher in the illustration than the contact 70. The interconnect 77 is connected to the upper end of the contact 66 and to the upper end of the contact 69 and the upper end of the contact 71 disposed lower in the illustration than the contact 66.

Each of the contacts described above may include contacts of multiple levels arranged in the Z-direction; and these multiple-level contacts may be connected via intermediate interconnects. For example, the contacts 61 to 64, 72, and 73 each may include contacts of two or more levels arranged in the Z-direction and may be connected via intermediate interconnects provided in the same layer as the interconnects 76 and 77.

As a result of electrically connecting the transistors as described above, the circuit shown in FIG. 4B is configured in each of the data latch circuits 16.

In other words, the p-channel transistor p1 and the p-channel transistor p2 are connected to each other because one of the source or the drain of the p-channel transistor p1 and one of the source or the drain of the p-channel transistor p2 are the common p-type layer 35. The other of the source or the drain of the p-channel transistor p2 is connected to one of the source or the drain of the n-channel transistor n1 and one of the source or the drain of the n-channel transistor n2 via the contact 69, the interconnect 77, and the contact 71 and connected to the common gate 53 of the p-channel transistor p4 and the n-channel transistor n3 via the contact 69, the interconnect 77, and the contact 66.

On the other hand, the p-channel transistor p3 and the p-channel transistor p4 are connected to each other because one of the source or the drain of the p-channel transistor p3 and one of the source or the drain of the p-channel transistor p4 are the common p-type layer 32. The other of the source or the drain of the p-channel transistor p4 is connected to one of the source or the drain of the n-channel transistor n4 and one of the source or the drain of the n-channel transistor n3 via the contact 67, the interconnect 76, and the contact 65 and connected to the common gate 54 of the p-channel transistor p2 and the n-channel transistor n2 via the contact 67, the interconnect 76, and the contact 70.

A power supply potential VDD which is a first reference potential is applied via the contact 61 to the other of the source or the drain of the p-channel transistor p1 (the p-type layer 36) and the other of the source or the drain of the p-channel transistor p3 (the p-type layer 31). The other of the source or the drain of the n-channel transistor n2 and the other of the source or the drain of the n-channel transistor n3 are the common n-type layer 43; and a ground potential GND which is a second reference potential is applied to the common n-type layer 43 via the contact 68. Although the second reference potential is not limited to the ground potential, the second reference potential is lower than the first reference potential.

Control signals Vc are input respectively to the gate 56 of the n-channel transistor n1 and the gate 52 of the n-channel transistor n4 via the contact 73 and the contact 64. Select signals Vs1 and Vs2 are input respectively to the gate 55 of the p-channel transistor p1 and the gate 51 of the p-channel transistor p3 via the contact 72 and the contact 63. The other of the source or the drain of the n-channel transistor n1 (the n-type layer 45) and the other of the source or the drain of the n-channel transistor n4 (the n-type layer 41) are connectable to the sense amplifier 15 via the contact 62; and a data signal SA that is output from the sense amplifier 15 is applied. In the data latch circuit 16, the n-channel transistors n1 and n4 function as transfer gates; the n-channel transistors n2 and n3 function as drivers; and the p-channel transistors p1 to p4 function as loads.

The memory array substrate 80 will now be described.

In the memory array substrate 80 as shown in FIG. 5, a source line 83 that is made of a conductive material is provided on the silicon substrate 81. A stacked body 85 is provided on the source line 83. Insulating films 86 and electrode films 87 are stacked alternately in the stacked body 85.

A core member 90 that extends in the stacking direction of the insulating films 86 and the electrode films 87 is provided inside the stacked body 85. The core member 90 is made of, for example, an insulating material such as silicon oxide, etc. The configuration of the core member 90 is columnar, e.g., substantially circular columnar. A silicon pillar 91 is provided on the periphery and the lower surface of the core member 90. The lower end of the silicon pillar 91 is connected to the source line 83.

A tunneling insulating film 92, a charge storage film 93, and a blocking insulating film 94 are stacked in this order at the periphery of the silicon pillar 91. Although the tunneling insulating film 92 normally is insulative, the tunneling insulating film 92 is a film in which a tunneling current flows when a prescribed voltage within the range of the drive voltage of the semiconductor memory device 1 is applied; and the tunneling insulating film 92 is, for example, a single-layer silicon oxide film or an ONO film in which a silicon oxide layer, a silicon nitride layer, and a silicon oxide layer are stacked in this order.

The charge storage film 93 is a film that can store charge, is made from, for example, a material having trap sites of electrons, and is made of, for example, silicon nitride. Instead of the insulative charge storage film 93, a conductive floating gate electrode may be provided as the charge storage portion. In such a case, the floating gate electrode is divided every electrode film 87. The blocking insulating film 94 is a film in which a current substantially does not flow even when a voltage within the range of the drive voltage of the semiconductor memory device 1 is applied. The blocking insulating film 94 includes, for example, a material having a dielectric constant higher than that of silicon oxide.

The inter-layer insulating film 82 is provided above and sideward of the stacked body 85. A plug 96 and a bit line 97 are provided on the stacked body 85 inside the inter-layer insulating film 82. The upper end of the silicon pillar 91 is connected to the bit line 97 via the plug 96. The bit line 97 is connected to the sense amplifier 15 of the control circuit substrate 10 (referring to FIG. 2).

By such a configuration, a memory cell transistor is formed at each crossing portion between the silicon pillar 91 and the electrode films 87. In the memory cell transistor, the silicon pillar 91 is the channel; the electrode film 87 is the gate; and the blocking insulating film 94 is the gate insulating film. Then, data is stored by changing the threshold of the memory cell transistor by storing charge in the charge storage film 93. For example, the threshold of the memory cell transistor can have eight levels of values. Thereby, three bits of data can be stored in one memory cell transistor.

Operations of the semiconductor memory device according to the embodiment will now be described.

In the initial state as shown in FIG. 4B, the select signals Vs1 and Vs2, control signals Vc1 and Vc2, and the data signal SA each are "L" (the low level). Therefore, the p-channel transistors p1 and p3 are in the on-state; and the n-channel transistors n1 and n4 are in the off-state.

From this state, in the data latch circuit 16 caused to hold the data, the select signal Vs2 is set to "H" (the high level); and the p-channel transistor p3 is set to the off-state. Also, the control signal Vc2 is set to "H;" and the n-channel transistor n4 is set to the on-state. Thereby, the potential of a connection point N2 between the p-channel transistor p4 and the n-channel transistor n3 becomes "L." As a result, the p-channel transistor p2 is set to the on-state; the n-channel transistor n2 is set to the off-state; therefore, the potential of a connection point N1 between the p-channel transistor p2 and the n-channel transistor n2 becomes "H." Thereby, the p-channel transistor p4 is set to the off-state; the n-channel transistor n3 is set to the on-state; therefore, the potential of the connection point N2 is stable at "L." Subsequently, the select signal Vs2 returns to "L;" and the p-channel transistor p3 is set to the on-state. Also, the control signal Vc2 returns to "L;" and the n-channel transistor n4 is set to the off-state.

As shown in FIG. 5, when the data is read from the memory cell transistor, a current flows between the source line 83 and the bit line 97; and the current is input to the sense amplifier 15 of the sense amplifier circuit 14 shown in FIG. 2. The sense amplifier 15 detects the value based on the input current and outputs the value to the data latch circuit 16 as the data signal SA. At this time, the sense amplifier 15 sets the data signal SA once to "H" and subsequently outputs the original data signal SA. Then, the n-channel transistor n1 is set to the on-state by setting the control signal Vc1 to "H;" and the value of the data signal SA is written to the data latch circuit 16.

In the case where the data signal SA is "H," the potential of the connection point N1 remains "H" because the n-channel transistor n1 is in the on-state; therefore, the potential of the connection point N2 is fixed at "L."

In the case where the data signal SA is "L," the potential of the connection point N1 becomes "L" because the n-channel transistor n1 is in the on-state. Therefore, the p-channel transistor p4 is set to the on-state; and the n-channel transistor n3 is set to the off-state. Accordingly, the potential of the connection point N2 becomes "H." Thereby, the p-channel transistor p2 is set to the off-state; and the n-channel transistor n2 is set to the on-state. As a result, the potential of the connection point N1 is fixed at "L."

Summarizing, in the case where the data signal SA is "H," the potential of the connection point N1 is fixed at "H;" and the potential of the connection point N2 is fixed at "L." On the other hand, in the case where the data signal SA is "L," the potential of the connection point N1 is fixed at "L;" and the potential of the connection point N2 is fixed at "H." Thus, the data latch circuit 16 can store the potential of the data signal SA; and the value that is indicated by the data signal SA can be held. For example, binary data can be held by the value "0" corresponding to the potential "H" of the data signal SA and by the value "1" corresponding to the potential "L."

Effects of the embodiment will now be described.

In the embodiment, both the gate of the p-channel transistor p4 and the gate of the n-channel transistor n3 are realized by one gate 53. Also, both the gate of the p-channel transistor p2 and the gate of the n-channel transistor n2 are realized by one gate 54. Thereby, the number of gates inside the data latch circuit 16 can be reduced; and the data latch circuit 16 can be downsized.

Inside each of the data latch circuits 16, the p-channel transistors p1 to p4 and the n-channel transistors n1 to n4 are divided in the X-direction and have layouts of the data latch circuits 16 adjacent to each other in the X-direction that are mirror images of each other. Thereby, the gates 51, 52, 55, and 56 can be used commonly between the data latch circuits 16 adjacent to each other in the X-direction. The data latch circuit 16 can be downsized thereby.

In the embodiment, the control circuit that includes the sense amplifier region 13 is provided in the control circuit substrate 10; and the memory cell transistors are provided in the memory array substrate 80. Thus, because the control circuit is formed in a dedicated substrate, the manufacturing processes of the control circuit are not exposed to the thermal history necessary for forming the memory cell transistors; therefore, the p-channel transistors p1 to p4 and the n-channel transistors n1 to n4 themselves can be downscaled. The data latch circuit 16 can be downsized thereby.

By downsizing the data latch circuit 16, the sense amplifier circuit 14 can be downsized; and even the entire semiconductor memory device 1 can be downsized. Conversely, more data latch circuits 16 can be provided in each of the sense amplifier circuits 14 if the surface area of the sense amplifier circuit 14 is constant. Thereby, more data can be held in each of the sense amplifier circuits 14, which means that the transfer rate of the data can remain constant even when downscaling the memory cell transistor which causes a decrease of the channel surface area, an increase of the fluctuation of the threshold due to the increase or decrease of one electron stored in the charge storage film 93, and an increase of the time necessary to write and read the data.

Second Embodiment

A second embodiment will now be described.

Figure 6:
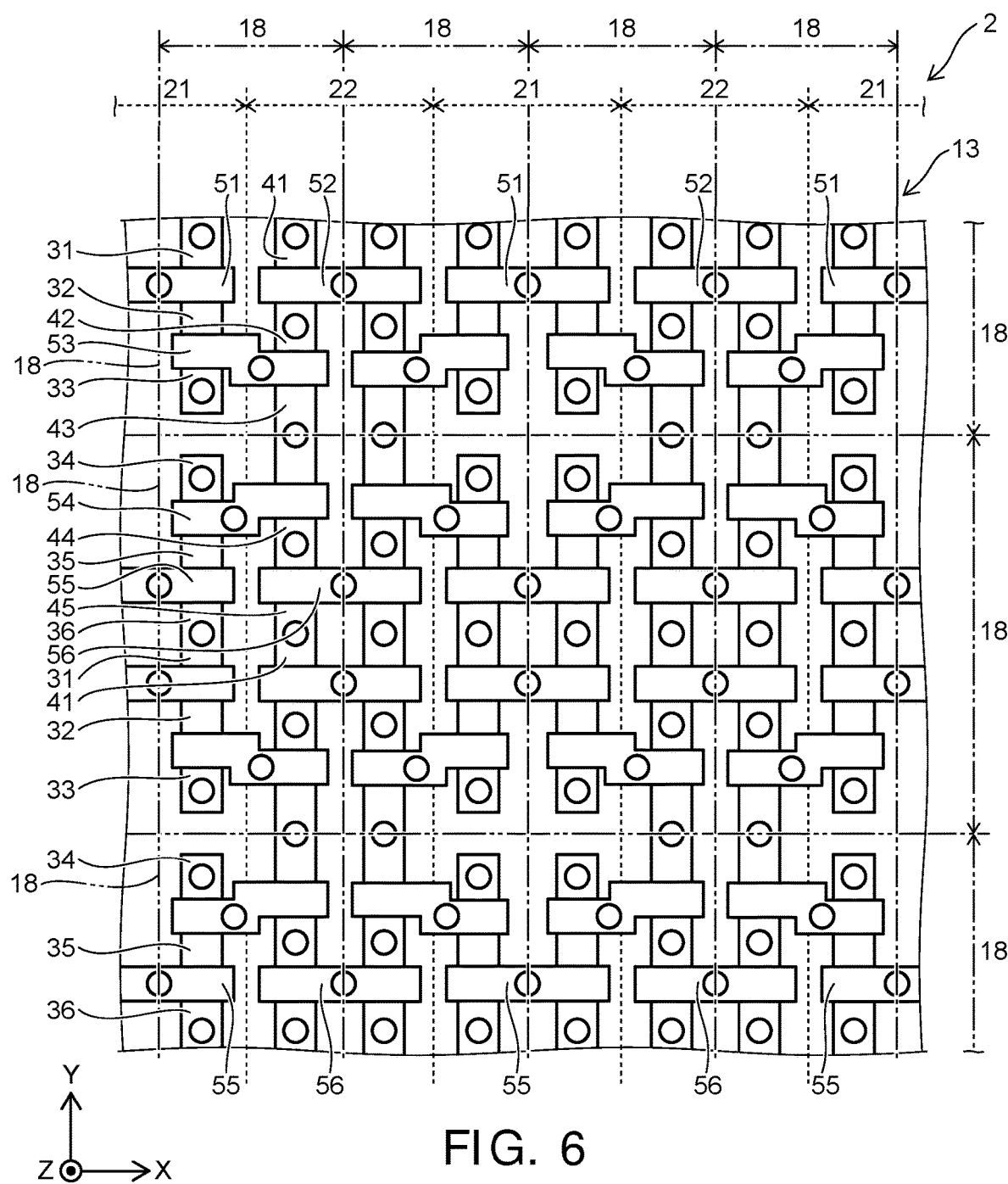
FIG. 6 is a plan view showing data latch circuits according to a second embodiment.

FIG. 6 is a plan view showing data latch circuits according to the embodiment.

Figures 7A, 7B:
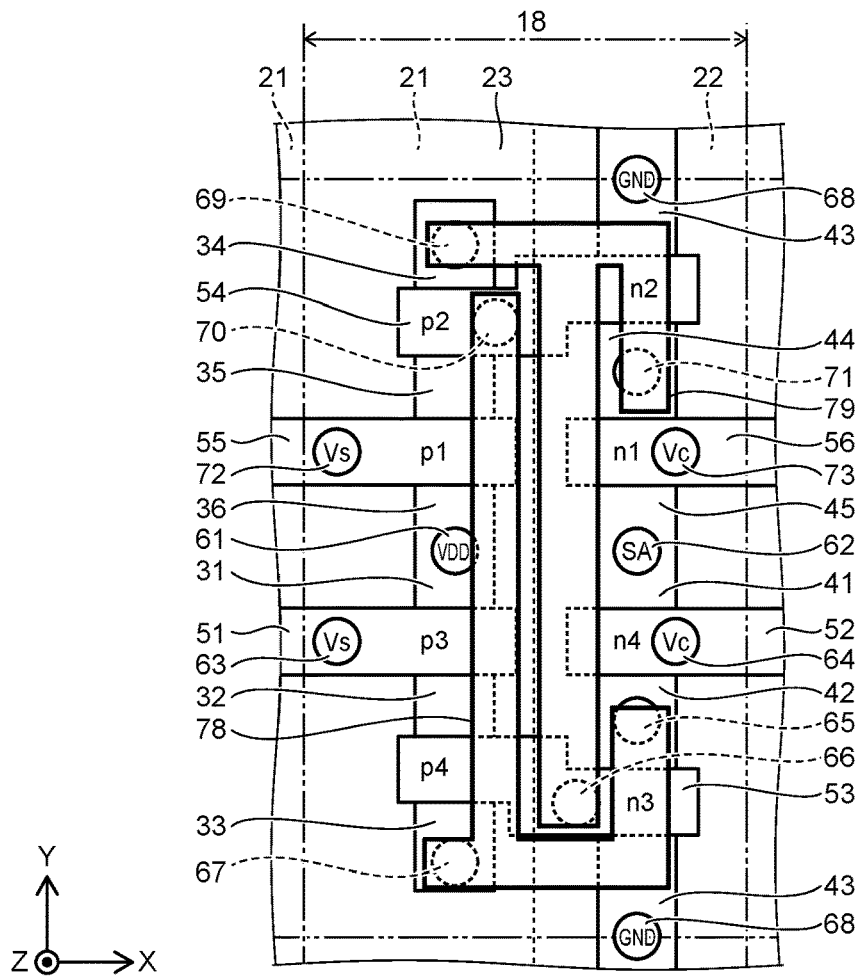
FIG. 7A is a plan view showing one data latch circuit.
FIG. 7B is a circuit diagram of the one data latch circuit.

FIG. 7A is a plan view showing one data latch circuit; and FIG. 7B is a circuit diagram of the one data latch circuit.

In the semiconductor memory device 2 according to the embodiment as shown in FIG. 6 and FIG. 7A, compared to the semiconductor memory device 1 according to the first embodiment described above (referring to FIG. 1 to FIG. 5), the configurations of the p-channel transistors p1 to p4 and the n-channel transistors n1 to n4 are the same; but the configurations of the interconnects are different. As a result, the region where a data latch circuit 18 according to the embodiment is formed is different from the region where the data latch circuit 16 according to the first embodiment is formed.

A specific description is as follows.

In the sense amplifier region 13 of the embodiment, the configurations, the positional relationships, and the connectional relationships of the n-well 21, the p-well 22, the p-type layers 31 to 36, the n-type layers 41 to 45, the gates 51 to 56, and the contacts 61 to 73 are similar to those of the first embodiment.

However, in the embodiment, interconnects 78 and 79 are provided instead of the interconnects 76 and 77 of the first embodiment. The interconnect 78 is connected to the upper end of the contact 70 and connected to the upper end of the contact 67 and the upper end of the contact 65 disposed lower in the illustration than the contact 70. The interconnect 79 is connected to the upper end of the contact 66 and connected to the upper end of the contact 69 and the upper end of the contact 71 disposed higher in the illustration than the contact 66.

Thereby, each of the data latch circuits 18 corresponds to a rectangular region including one island-shaped semiconductor region disposed in the n-well 21 and surrounded with the STI 23 at the periphery, and a portion of a band-shaped semiconductor region disposed in the p-well 22. The p-type layers 34, 35, 36, 31, 32, and 33 are arranged in this order in the island-shaped semiconductor region. The p-type layer 36 and the p-type layer 31 are continuous; but the p-type layers other than the p-type layer 36 and the p-type layer 31 are separated from each other; and a portion of the n-well 21 is interposed between the mutually-adjacent p-type layers. The n-type layers 43, 44, 45, 41, and 42 are arranged in this order in a portion of the band-shaped semiconductor region. The n-type layer 45 and the n-type layer 41 are continuous; but the n-type layers other than the n-type layer 45 and the n-type layer 41 are separated from each other; and a portion of the p-well 22 is interposed between the mutually-adjacent n-type layers.

As shown in FIG. 7B, a circuit similar to that of the first embodiment can be realized by such a configuration.

Otherwise, the configuration, the operations, and the effects of the embodiment are similar to those of the first embodiment described above.

Third Embodiment

A third embodiment will now be described.

Figure 8:
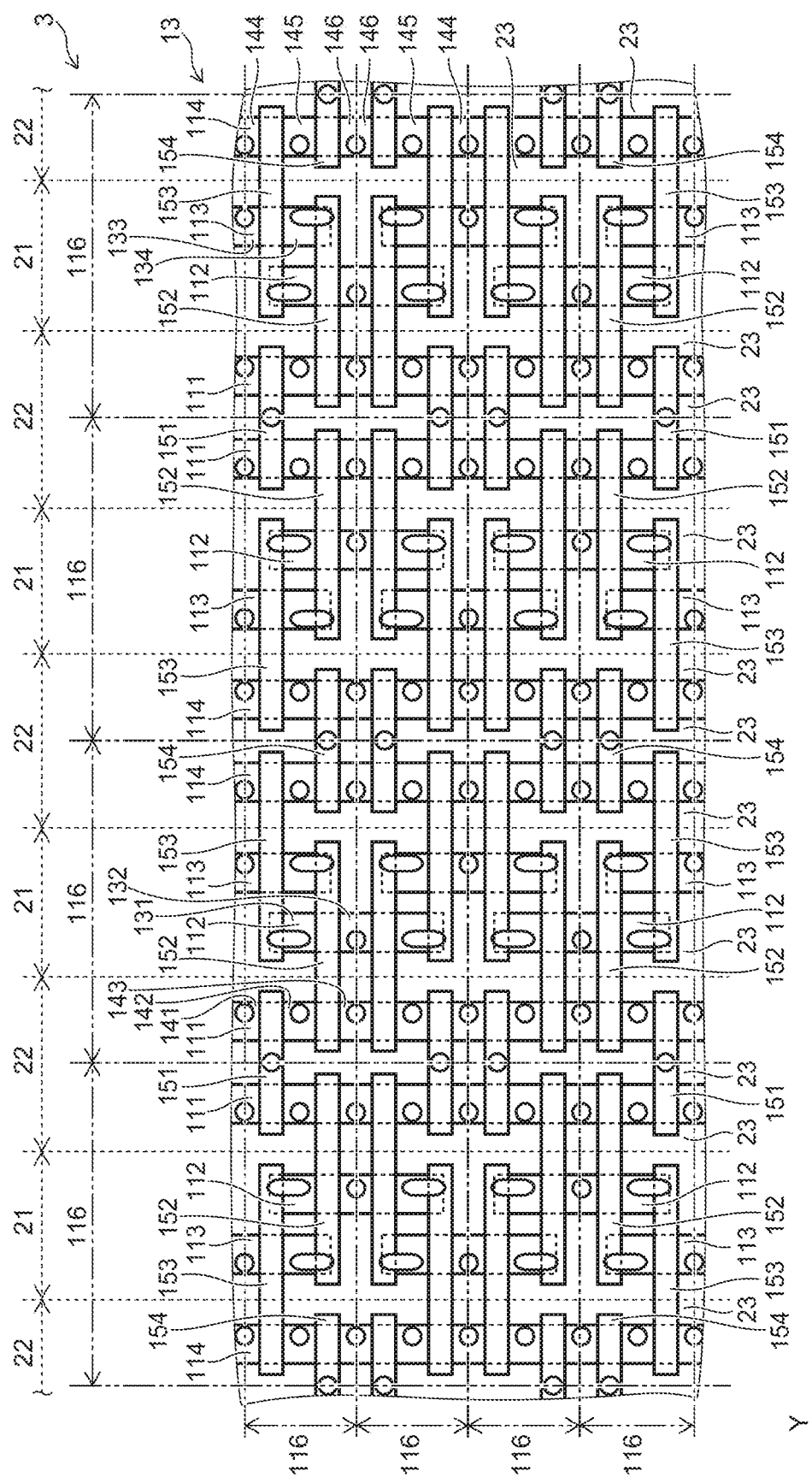
FIG. 8 is a plan view showing semiconductor regions, gates, and contacts of data latch circuits according to a third embodiment.

FIG. 8 is a plan view showing the semiconductor regions, the gates, and the contacts of the data latch circuits according to the embodiment.

Figure 9:
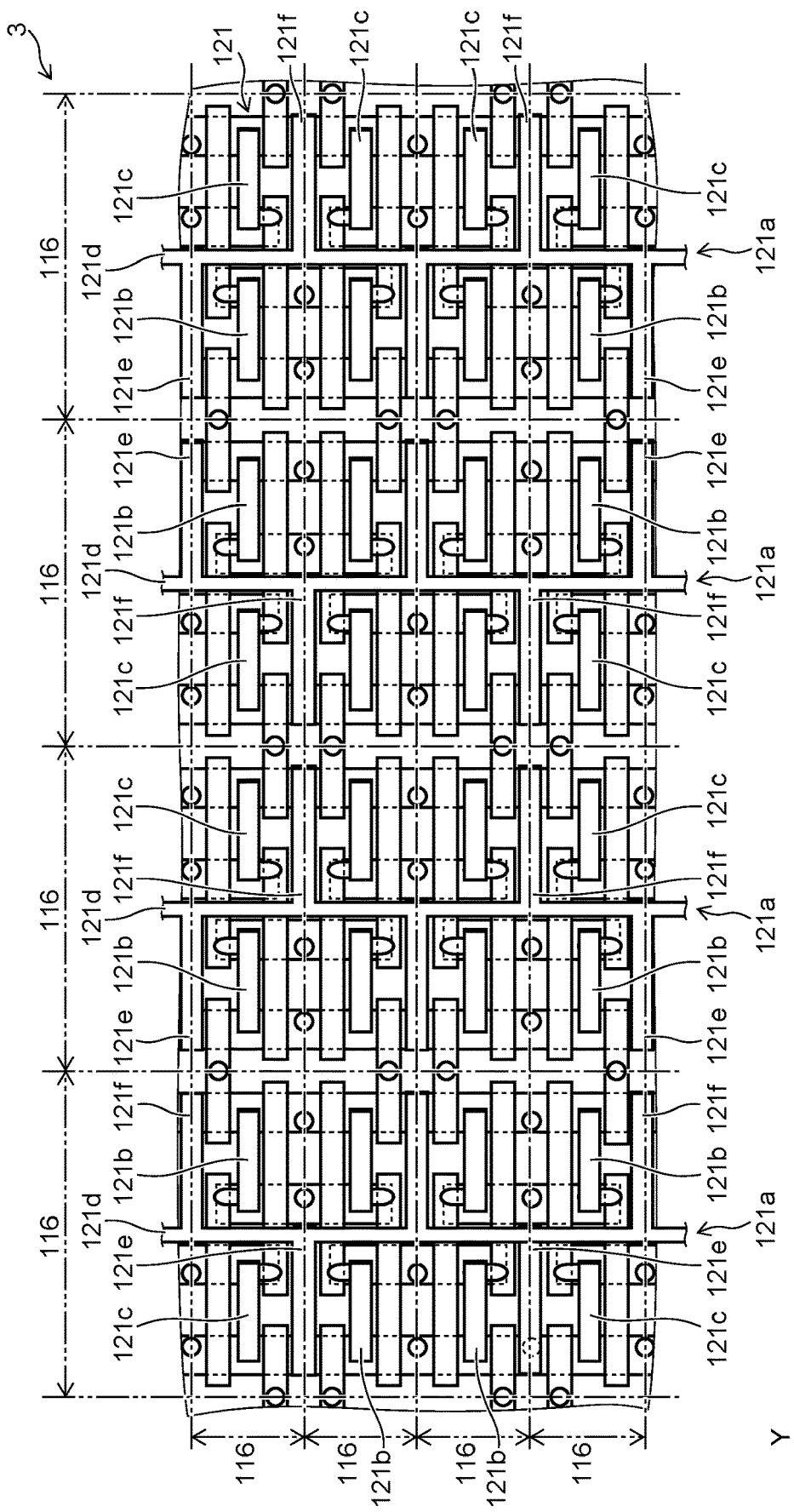
FIG. 9 is a plan view showing the semiconductor regions, the gates, the contacts, and a first interconnect layer of the data latch circuits according to the third embodiment.

FIG. 9 is a plan view showing the semiconductor regions, the gates, the contacts, and a first interconnect layer of the data latch circuits according to the embodiment.

Figure 10:
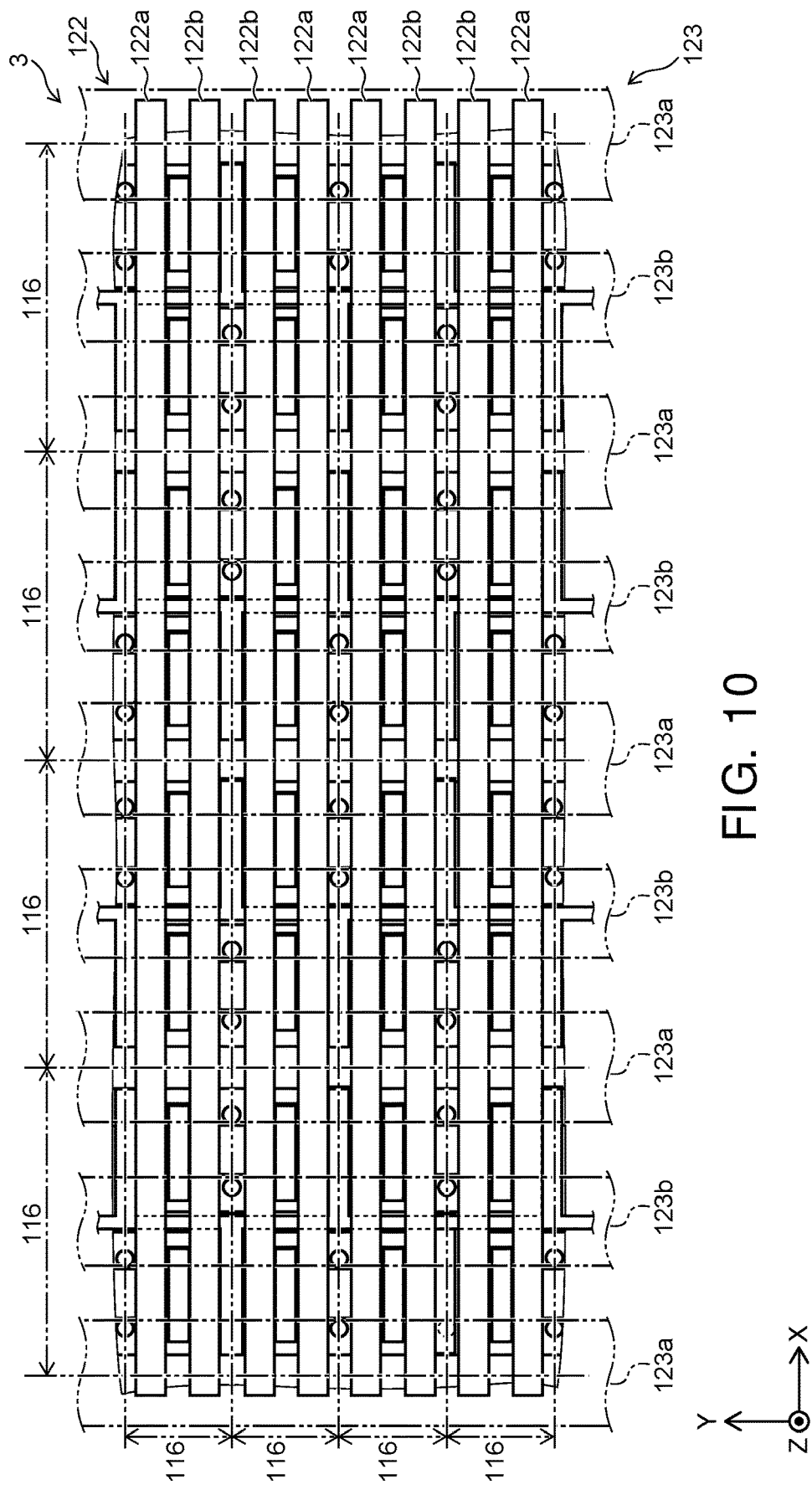
FIG. 10 is a plan view showing the semiconductor regions, the gates, the contacts, the first interconnect layer, a second interconnect layer, and a third interconnect layer of the data latch circuits according to the third embodiment.

FIG. 10 is a plan view showing the semiconductor regions, the gates, the contacts, the first interconnect layer, a second interconnect layer, and a third interconnect layer of the data latch circuits according to the embodiment.

Figure 11A:
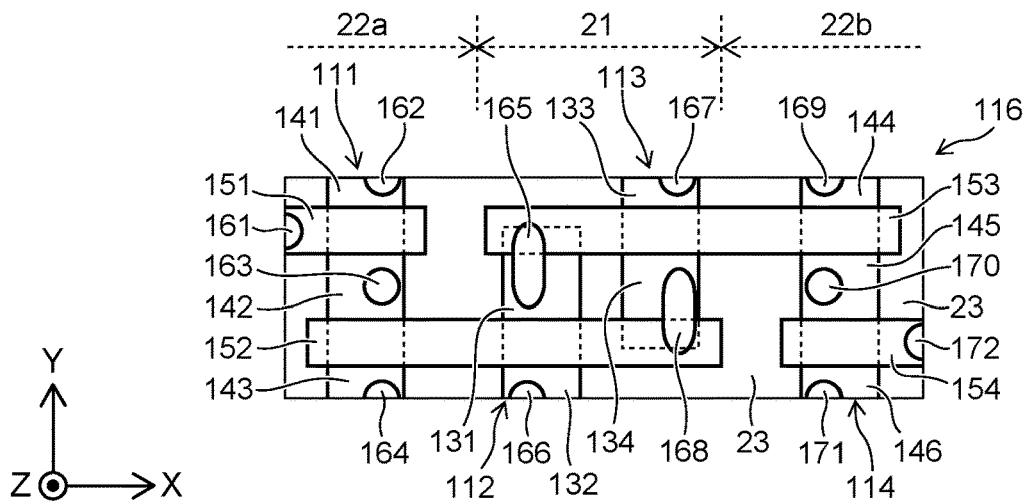
FIGS. 11A to 11C are plan views showing one data latch circuit according to the third embodiment.
Figure 11B:
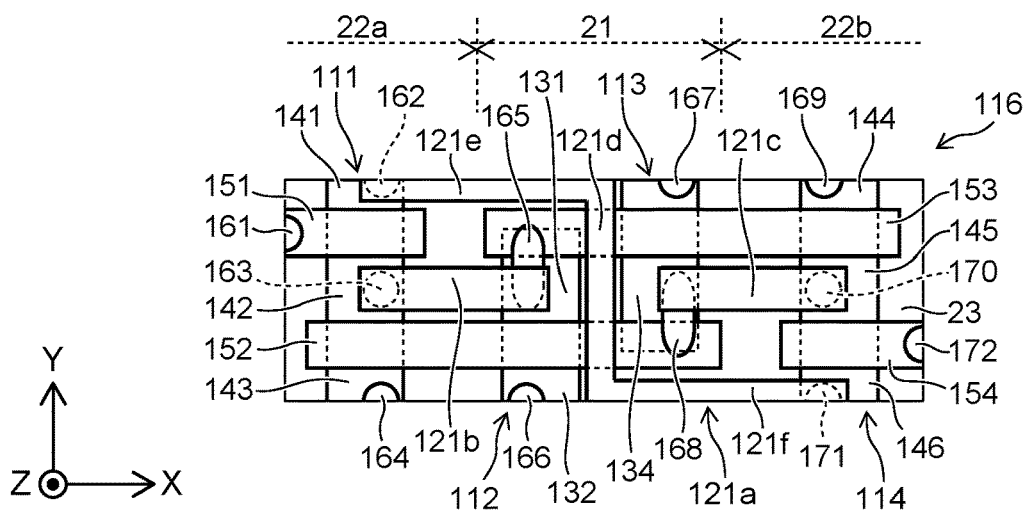
Figure 11C:
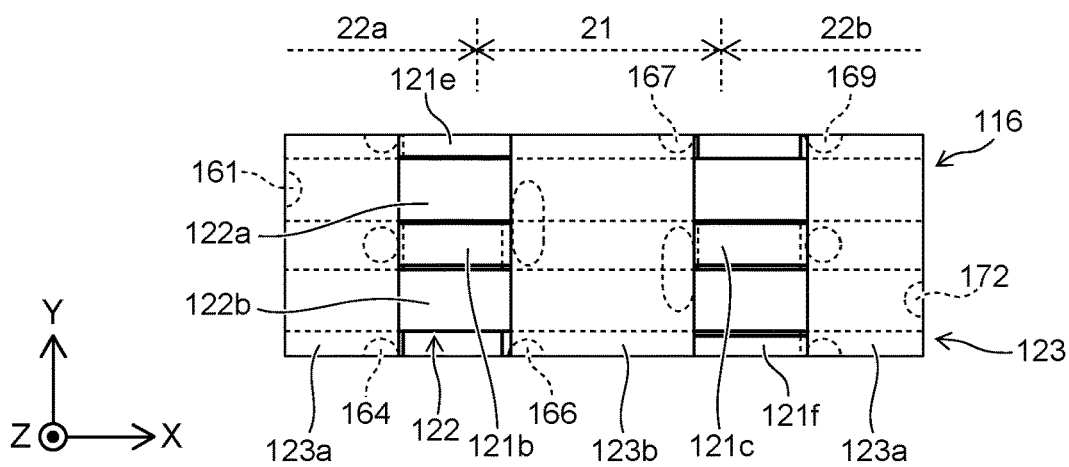

FIGS. 11A to 11C are plan views showing one data latch circuit according to the embodiment; FIG. 11A shows the semiconductor regions, the gates, and the contacts; FIG. 11B shows the first interconnect layer in addition to FIG. 11A; and FIG. 11C shows the second interconnect layer and the third interconnect layer in addition to FIG. 11B.

Figure 12:
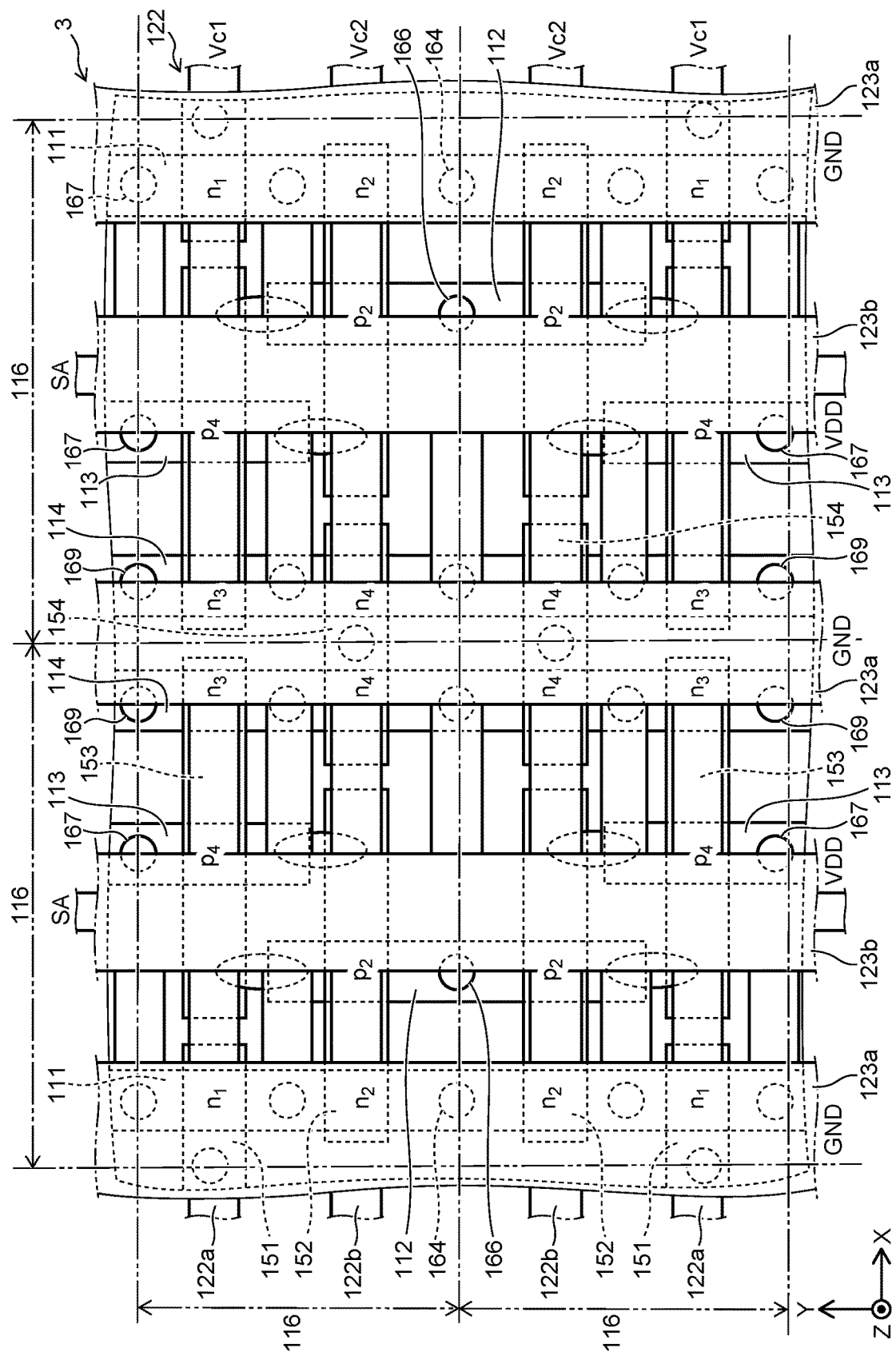
FIG. 12 is a plan view showing four data latch circuits according to the third embodiment.

FIG. 12 is a plan view showing four data latch circuits according to the embodiment.

Figure 13A:
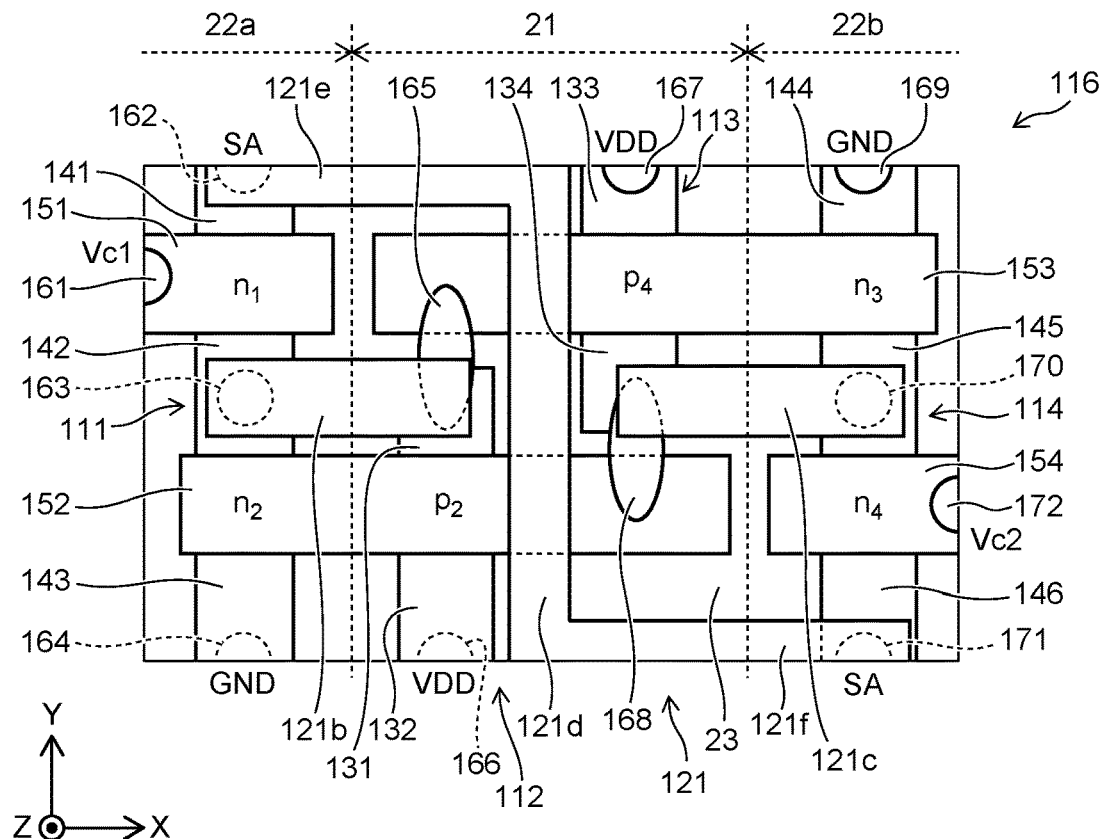
FIG. 13A is a plan view showing one data latch circuit according to the third embodiment.
Figure 13B:
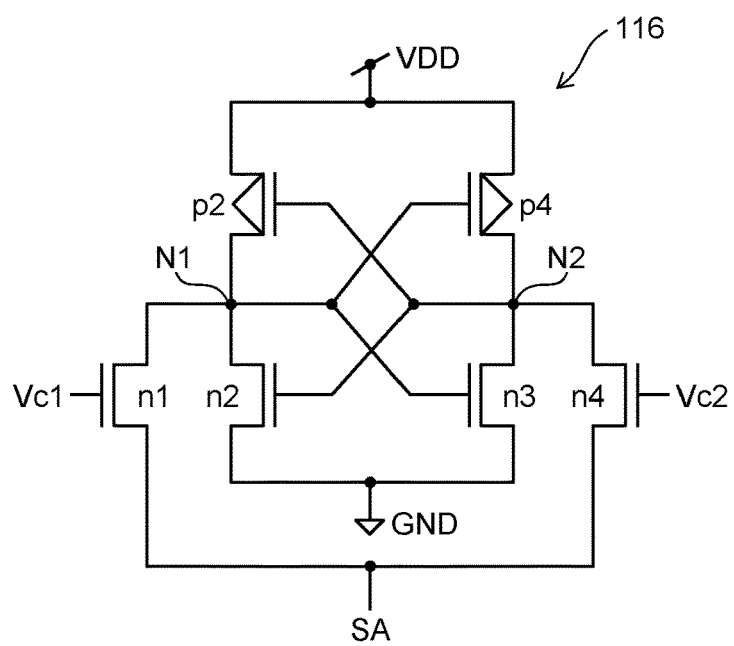
FIG. 13B is a circuit diagram of the one data latch circuit.

FIG. 13A is a plan view showing one data latch circuit according to the embodiment; and FIG. 13B is a circuit diagram of the one data latch circuit.

FIG. 8 to FIG. 10 summarily show the relationship of the layouts between the multiple data latch circuits; and a portion of the detailed configuration of each data latch circuit is not illustrated for easier viewing of the drawing. On the other hand, FIGS. 11A to 11C and FIG. 13A show the configuration of one data latch circuit in detail; and the relationship with the other data latch circuits is not shown. FIG. 12 shows an intermediate concept; and four data latch circuits in two rows and two columns are shown.

In the semiconductor memory device 3 according to the embodiment, compared to the semiconductor memory device 1 according to the first embodiment described above (referring to FIG. 1 to FIG. 5), the configuration of the data latch circuit is different. The configuration of the memory array substrate 80 is similar to that of the first embodiment.

First, the wells, the n-type layers, the p-type layers, and the gates that are provided on the silicon substrate 11 will be described.

In the semiconductor memory device 3 according to the embodiment as shown in FIG. 8, the n-well 21 and the p-well 22 are arranged alternately along the X-direction on the silicon substrate 11. The n-wells 21 and the p-wells 22 each extend in the Y-direction. Each of the data latch circuits 116 is set over one n-well 21 and over regions of half of each of two p-wells p 22 disposed on the two sides of the one n-well 21. The length of the data latch circuit 116 in the X-direction is equal to the total of the length of one n-well 21 and the length of one p-well 22.

In the sense amplifier region 13 of the semiconductor memory device 3, the multiple data latch circuits 116 are arranged in a matrix configuration along the X-direction and the Y-direction. The layouts of two data latch circuits 116 adjacent to each other in the X-direction are mirror images of each other; and the layouts of two data latch circuits 116 adjacent to each other in the Y-direction also are mirror images of each other.

In FIGS. 11A to 11C and FIG. 13A, the p-well 22 that is included in each of the data latch circuits 116 is described as being divided into a p-well 22a and a p-well 22b for convenience of description. Inside each of the data latch circuits 116, the p-well 22a and the p-well 22b are separated from each other with the n-well 21 interposed. On the other hand, the p-well 22a of one data latch circuit 116 is continuous with the p-well 22b of the data latch circuit 116 adjacent to the one data latch circuit 116 in the X-direction.

As shown in FIG. 11A, n-type layers 141 to 143 that have the n-conductivity type are provided on the p-well 22a. The n-type layers 141 to 143 are separated from each other and arranged in one column in this order along the Y-direction. Between the data latch circuits 116 adjacent to each other in the Y-direction, the n-type layers 141 are continuous with each other; and the n-type layers 143 are continuous with each other. Portions of the p-well 22a are interposed respectively between the n-type layer 141 and the n-type layer 142 and between the n-type layer 142 and the n-type layer 143.

Thereby, on each of the p-wells 22a, multiple sets of the n-type layers 141 to 143 arranged along the Y-direction form one semiconductor region (active area) 111 having a line configuration with the p-well 22a interposed between these n-type layers. The semiconductor region 111 includes the n-type layer 141, the portion of the p-well 22a between the n-type layer 141 and the n-type layer 142, the n-type layer 142, the portion of the p-well 22a between the n-type layer 142 and the n-type layer 143, and the n-type layer 143 of each of the data latch circuits 116. One semiconductor region 111 extends in the Y-direction over the multiple data latch circuits 116 arranged along the Y-direction.

P-type layers 131 and 132 that are of the p-conductivity type are provided on the n-well 21. The p-type layer 131 and the p-type layer 132 are separated from each other in the Y-direction. The p-type layers 132 are continuous with each other between the data latch circuits 116 adjacent to each other in the Y-direction. A portion of the n-well 21 is interposed between the p-type layer 131 and the p-type layer 132.

Thereby, on each of the n-wells 21, an island-shaped semiconductor region (an active area) 112 is formed of the p-type layer 131, the portion of the n-well 21 between the p-type layer 131 and the p-type layer 132, the common p-type layer 132, the portion of the n-well 21 between the p-type layer 132 and the p-type layer 131, and the p-type layer 131 arranged consecutively in this order along the Y-direction over two data latch circuits 116 adjacent to each other in the Y-direction.

P-type layers 133 and 134 that are of the p-conductivity type are provided on the n-well 21. The p-type layer 133 and the p-type layer 134 are separated from each other in the Y-direction. The p-type layers 133 are continuous with each other between the data latch circuits 116 adjacent to each other in the Y-direction. A portion of the n-well 21 is interposed between the p-type layer 133 and the p-type layer 134.

Thereby, on each of the n-wells 21, an island-shaped semiconductor region (an active area) 113 is formed of the p-type layer 134, the portion of the n-well 21 between the p-type layer 134 and the p-type layer 133, the common p-type layer 133, the portion of the n-well 21 between the p-type layer 133 and the p-type layer 134, and the p-type layer 134 arranged consecutively in this order along the Y-direction over two data latch circuits 116 adjacent to each other in the Y-direction.

N-type layers 144 to 146 that have the n-conductivity type are provided on the p-well 22b. The n-type layers 144 to 146 are separated from each other and arranged in one column in this order along the Y-direction. Between the data latch circuits 116 adjacent to each other in the Y-direction, the n-type layers 144 are continuous with each other; and the n-type layers 146 also are continuous with each other. Portions of the p-well 22b are interposed respectively between the n-type layer 144 and the n-type layer 145 and between the n-type layer 145 and the n-type layer 146.

Thereby, on each of the p-wells 22b, multiple sets of the n-type layers 144 to 146 arranged along the Y-direction form one semiconductor region (active area) 114 having a line configuration with the p-well 22b interposed between these n-type layers. The semiconductor region 114 includes the n-type layer 144, the portion of the p-well 22b between the n-type layer 144 and the n-type layer 145, the n-type layer 145, the portion of the p-well 22b between the n-type layer 145 and the n-type layer 146, and the n-type layer 146 of each of the data latch circuits 116. The one semiconductor region 114 extends over the multiple data latch circuits 116 arranged along the Y-direction.

In the entire sense amplifier region 13, the semiconductor region 111 extends to be continuous along the Y-direction. The semiconductor region 112 is arranged in one column discontinuously along the Y-direction. The semiconductor region 113 also is arranged in one column discontinuously along the Y-direction. The semiconductor region 114 extends to be continuous along the Y-direction.

The semiconductor regions 111 to 114 are arranged in this order along the X-direction and are separated from each other. The positions in the Y-direction of the n-type layer 141, the p-type layer 133, and the n-type layer 144 are substantially the same; the positions in the Y-direction of the n-type layer 142, the p-type layer 131, the p-type layer 134, and the n-type layer 145 are substantially the same; and the positions in the Y-direction of the n-type layer 143, the p-type layer 132, and the n-type layer 146 are substantially the same.

The STI 23 is disposed between the semiconductor regions 111 to 114. The combination is different between the two data latch circuits 116 sharing the semiconductor region 112 and the two data latch circuits 116 sharing the semiconductor region 113. In other words, one data latch circuit 116 shares the semiconductor region 112 with the data latch circuit 116 on one Y-direction side and shares the semiconductor region 113 with the data latch circuit 116 on the other Y-direction side.

Gates 151 to 154 are provided in each of the data latch circuits 116. The gates 151 to 154 extend in substantially the X-direction and cross the semiconductor regions 111 to 114 described above. The gates 151 to 154 have band configurations extending in the X-direction when viewed from the Z-direction. Gate insulating films (not illustrated) are provided between the gates 151 to 154 and the semiconductor regions 111 to 114. The positional relationship between the gates 151 to 154 and the semiconductor regions 111 to 114 will now be described.

The gate 151 crosses the semiconductor region 111. Specifically, a portion of the gate 151 is disposed in the region directly above the portion of the p-well 22a between the n-type layer 141 and the n-type layer 142. In the data latch circuits 116 adjacent to each other in the X-direction, the gate 151 is a common gate. In other words, one gate 151 that extends in the X-direction crosses the semiconductor region 111 in each of two data latch circuits 116 adjacent to each other in the X-direction and having layouts that are mirror images of each other.

The gate 152 crosses the semiconductor region 111 and the semiconductor region 112. Specifically, a portion of the gate 152 is disposed in the region directly above the portion of the p-well 22a between the n-type layer 142 and the n-type layer 143; and another portion of the gate 152 is disposed in the region directly above the portion of the n-well 21 between the p-type layer 131 and the p-type layer 132. The gate 152 is disposed in the interior of each of the data latch circuits 116 and does not straddle between the mutually-adjacent data latch circuits 116.

The gate 153 crosses the semiconductor region 113 and the semiconductor region 114. Specifically, a portion of the gate 153 is disposed in the region directly above the portion of the n-well 21 between the p-type layer 133 and the p-type layer 134; and another portion of the gate 153 is disposed in the region directly above the portion of the p-well 22b between the n-type layer 144 and the n-type layer 145. The gate 153 is disposed in the interior of each of the data latch circuits 116 and does not straddle between the mutually-adjacent data latch circuits 116.

The gate 154 crosses the semiconductor region 114. Specifically, a portion of the gate 154 is disposed in the region directly above the portion of the p-well 22b between the n-type layer 145 and the n-type layer 146. In the data latch circuits 116 adjacent to each other in the X-direction, the gate 154 is a common gate. In other words, one gate 154 that extends in the X-direction crosses the semiconductor region 114 in each of two data latch circuits 116 adjacent to each other in the X-direction and having layouts that are mirror images of each other.

The combination is different between the two data latch circuits 116 sharing the gate 151 and the two data latch circuits 116 sharing the gate 154. One data latch circuit 116 shares the gate 151 with the data latch circuit 116 on one X-direction side and shares the gate 154 with the data latch circuit 116 on the other X-direction side. In the entire sense amplifier region 13, the gate 151 and the gate 153 are arranged in one column along the X-direction; and the gate 152 and the gate 154 are arranged in one column along the X-direction.

By the configuration described above as shown in FIGS. 13A and 13B, the two p-channel transistors p2 and p4 and the four n-channel transistors n1 to n4 are formed in each of the data latch circuits 116.

More specifically, the n-channel transistor n1 is formed of the n-type layer 141, the n-type layer 142, the portion of the p-well 22a between the n-type layer 141 and the n-type layer 142, and the gate 151. The n-channel transistor n2 is formed of the n-type layer 142, the n-type layer 143, the portion of the p-well 22a between the n-type layer 142 and the n-type layer 143, and the gate 152. The n-channel transistor n3 is formed of the n-type layer 144, the n-type layer 145, the portion of the p-well 22b between the n-type layer 144 and the n-type layer 145, and the gate 153. The n-channel transistor n4 is formed of the n-type layer 145, the n-type layer 146, the portion of the p-well 22b between the n-type layer 145 and the n-type layer 146, and the gate 154.

The p-channel transistor p2 is formed of the p-type layer 131, the p-type layer 132, the portion of the n-well 21 between the p-type layer 131 and the p-type layer 132, and the gate 152. The p-channel transistor p4 is formed of the p-type layer 133, the p-type layer 134, the portion of the n-well 21 between the p-type layer 133 and the p-type layer 134, and the gate 153.

Thus, the n-channel transistor n2 and the p-channel transistor p2 share one gate 152. The n-channel transistor n3 and the p-channel transistor p4 share one gate 153. Also, the two n-channel transistors n1 that are provided in two data latch circuits 116 adjacent to each other in the X-direction share one gate 151. The two n-channel transistors n4 that are provided two data latch circuits 116 adjacent to each other in the X-direction share one gate 154.

The contacts will now be described.

As shown in FIG. 11A, FIG. 12, and FIG. 13A, contacts 161 to 172 are provided in each of the data latch circuits 116. The configurations of the contact 165 and the contact 168 when viewed from the Z-direction are ovals in which the lengths in the Y-direction are longer than the lengths in the X-direction. The configurations of the other contacts are substantially circles. However, in FIG. 13A, the contacts that belong to only one data latch circuit 116 are illustrated as circles or ovals; and the contacts that are shared with an adjacent data latch circuit 116 are illustrated as semicircles. Similarly to the first embodiment, each of the contacts may include contacts of multiple levels arranged in the Z-direction; and these multiple-level contacts may be connected via intermediate interconnects. The intermediate interconnects may be provided in the same layer as the first interconnect layer 121 or the second interconnect layer 122 described below.

The lower end of the contact 161 is connected to the gate 151. The contact 161 is shared by two data latch circuits 116 adjacent to each other in the X-direction. The lower end of the contact 162 is connected to the n-type layer 141. The contact 162 is shared by two data latch circuits 116 adjacent to each other in the Y-direction. The lower end of the contact 163 is connected to the n-type layer 142. The lower end of the contact 164 is connected to the n-type layer 143. The contact 164 is shared by two data latch circuits 116 adjacent to each other in the Y-direction. Thus, the contacts 162, 163, and 164 are connected to the same semiconductor region 111 and arranged along the Y-direction.

The contact 165 is connected to the gate 153 at the intermediate portion in the Z-direction; and the lower end of the contact 165 is connected to the p-type layer 131. The configuration of the contact 165 when viewed from the Z-direction is an oval in which the length in the Y-direction is longer than the length in the X-direction. The lower end of the contact 166 is connected to the p-type layer 132. The contact 166 is shared by two data latch circuits 116 adjacent to each other in the Y-direction. Thus, the contacts 165 and 166 are connected to the same semiconductor region 112 and arranged along the Y-direction.

The lower end of the contact 167 is connected to the p-type layer 133. The contact 167 is shared by two data latch circuits 116 adjacent to each other in the Y-direction. The contact 168 is connected to the gate 152 at the intermediate portion in the Z-direction; and the lower end of the contact 168 is connected to the p-type layer 134. The configuration of the contact 168 when viewed from the Z-direction is an oval in which the length in the Y-direction is longer than the length in the X-direction. Thus, the contacts 167 and 168 are connected to the same semiconductor region 113 and arranged along the Y-direction.

The lower end of the contact 169 is connected to the n-type layer 144. The contact 169 is shared by two data latch circuits 116 adjacent to each other in the Y-direction. The lower end of the contact 170 is connected to the n-type layer 145. The lower end of the contact 171 is connected to the n-type layer 146. The contact 171 is shared by two data latch circuits 116 adjacent to each other in the Y-direction. Thus, the contacts 169, 170, and 171 are connected to the same semiconductor region 114 and arranged along the Y-direction. The lower end of the contact 172 is connected to the gate 154. The contact 172 is shared by two data latch circuits 116 adjacent to each other in the X-direction.

The first interconnect layer 121, the second interconnect layer 122, and the third interconnect layer 123 are stacked in this order above the silicon substrate 11 and the gates. In other words, the first interconnect layer 121 is positioned higher than the gates 151 to 154; the second interconnect layer 122 is positioned in a layer higher than the first interconnect layer 121; and the third interconnect layer 123 is positioned in a layer higher than the second interconnect layer 122.

The first interconnect layer 121 will now be described.

As shown in FIG. 9, FIG. 11B, FIG. 12, and FIG. 13A, an interconnect 121a, an interconnect 121b, and an interconnect 121c are provided in the first interconnect layer 121. A trunk portion 121d and branch portions 121e and 121f are provided in the interconnect 121a. The trunk portion 121d of the interconnect 121a extends in the Y-direction through the X-direction central portion of each of the data latch circuits 116, that is, between the semiconductor region 112 and the semiconductor region 113.

The trunk portion 121d is provided over the multiple data latch circuits 116 arranged along the Y-direction. The trunk portion 121d passes through the region directly above the gate 152 and the region directly above the gate 153. The branch portion 121e of the interconnect 121a extends toward one X-direction side from the trunk portion 121d and is connected to the upper end of the contact 162. The branch portion 121e is shared by two data latch circuits 116 adjacent to each other in the Y-direction. The branch portion 121f of the interconnect 121a extends toward the other X-direction side from the trunk portion 121d and is connected to the upper end of the contact 171. The branch portion 121f is shared by two data latch circuits 116 adjacent to each other in the Y-direction. Thus, the interconnect 121a is connected to the n-type layer 141 via the contact 162 and connected to the n-type layer 146 via the contact 171.

The interconnect 121b extends in the X-direction and is connected to the upper end of the contact 163 and the upper end of the contact 165. Thereby, the n-type layer 142, the p-type layer 131, and the gate 153 are connected to each other via the contact 163, the interconnect 121b, and the contact 165. The interconnect 121c also extends in the X-direction and is connected to the upper end of the contact 168 and the upper end of the contact 170. Thereby, the n-type layer 145, the p-type layer 134, and the gate 152 are connected to each other via the contact 170, the interconnect 121c, and the contact 168.

The second interconnect layer 122 will now be described.

As shown in FIG. 10, FIG. 12, and FIG. 13A, interconnects 122a and 122b are provided in the second interconnect layer 122. The interconnects 122a and 122b have line configurations extending in the X-direction and are provided over the multiple data latch circuits 116 arranged along the X-direction.

The interconnect 122a is disposed to pass through the region directly above the gate 151 and the region directly above the gate 153 and is connected to the upper end of the contact 161. The interconnect 122a also passes through the region directly above the contact 165 but is not connected to the contact 165. Thereby, the interconnect 122a is connected to the gate 151 via the contact 161.

The interconnect 122b is disposed to pass through the region directly above the gate 152 and the region directly above the gate 154 and is connected to the upper end of the contact 172. The interconnect 122b also passes through the region directly above the contact 168 but is not connected to the contact 168. Thereby, the interconnect 122b is connected to the gate 154 via the contact 172.

The third interconnect layer 123 will now be described.

As shown in FIG. 10, FIG. 11C, FIG. 12, and FIG. 13A, interconnects 123a and 123b are provided in the third interconnect layer 123. The interconnects 123a and 123b have line configurations extending in the Y-direction and are provided over the multiple data latch circuits 116 arranged along the Y-direction. The interconnect 123a and the interconnect 123b are arranged alternately along the X-direction.

The interconnect 123a is disposed along the boundary line between the data latch circuits 116 adjacent to each other in the X-direction, belongs to, for example, two data latch circuits 116 adjacent to each other in the X-direction, and is disposed in the region directly above the semiconductor region 111 and the semiconductor region 114 adjacent to each other with the STI 23 interposed. The interconnect 123a is connected to the upper end of the contact 164 and the upper end of the contact 169. Thereby, the interconnect 123a is connected to the n-type layer 143 via the contact 164 and connected to the n-type layer 144 via the contact 169.

The interconnect 123b is disposed in the X-direction central portion of the data latch circuit 116 and is disposed in, for example, the region directly above the semiconductor region 112 and the region directly above the semiconductor region 113 of each of the data latch circuits 116. The interconnect 123b is connected to the upper end of the contact 166 and the upper end of the contact 167. Thereby, the interconnect 123b is connected to the p-type layer 132 via the contact 166 and connected to the p-type layer 133 via the contact 167.

As a result of electrically connecting the transistors as described above, the circuit shown in FIG. 13B is configured in each of the data latch circuits 116.

In other words, the n-channel transistor n1 and the n-channel transistor n2 are connected to each other because one of the source or the drain of the n-channel transistor n1 and one of the source or the drain of the n-channel transistor n2 are a common n-type layer 142. The n-type layer 142 is connected to one of the source or the drain of the p-channel transistor p2 (the p-type layer 131) and the common gate 153 of the p-channel transistor p4 and the n-channel transistor n3 via the contact 163, the interconnect 121b, and the contact 165.

Similarly, the n-channel transistor n3 and the n-channel transistor n4 are connected to each other because one of the source or the drain of the n-channel transistor n3 and one of the source or the drain of the n-channel transistor n4 are a common n-type layer 145. The n-type layer 145 is connected to one of the source or the drain of the p-channel transistor p4 (the p-type layer 134) and the common gate 152 of the p-channel transistor p2 and the n-channel transistor n2 via the contact 170, the interconnect 121c, and the contact 168. The other of the source or the drain of the n-channel transistor n1 (the n-type layer 141) and the other of the source or the drain of the n-channel transistor n4 (the n-type layer 146) are connected to the interconnect 121a respectively via the contact 162 and the contact 171. The interconnect 121a is connectable to the sense amplifier 15; and the data signal SA that is output from the sense amplifier 15 is applied to the interconnect 121a.

The other of the source or the drain of the n-channel transistor n2 (the n-type layer 143) is connected to the interconnect 123a of the third interconnect layer 123 via the contact 164. The other of the source or the drain of the n-channel transistor n3 (the n-type layer 144) is connected to the interconnect 123a of the third interconnect layer 123 via the contact 169. The ground potential GND is applied as the second reference potential to the interconnect 123a.

The other of the source or the drain of the p-channel transistor p2 (the p-type layer 132) is connected to the interconnect 123b of the third interconnect layer 123 via the contact 166. The other of the source or the drain of the p-channel transistor p4 (the p-type layer 133) is connected to the interconnect 123b of the third interconnect layer 123 via the contact 167. The power supply potential VDD is applied as the first reference potential to the interconnect 123b.

The gate 151 of the n-channel transistor n1 is connected to the interconnect 122a of the second interconnect layer 122 via the contact 161. The control signal Vc1 is input to the interconnect 122a. The gate 154 of the n-channel transistor n4 is connected to the interconnect 122b of the second interconnect layer 122 via the contact 172. The control signal Vc2 is input to the interconnect 122b.

Operations of the semiconductor memory device according to the embodiment will now be described.

In the initial state as shown in FIG. 13B, the control signals Vc1 and Vc2 and the data signal SA each are "L." Therefore, the n-channel transistors n1 and n4 are in the off-state.

From this state, in the data latch circuit 116 caused to hold the data, the control signal Vc2 is set to "H;" and the n-channel transistor n4 is set to the on-state. Thereby, the potential of the connection point N2 between the p-channel transistor p4 and the n-channel transistor n3 becomes "L." As a result, the p-channel transistor p2 is set to the on-state; the n-channel transistor n2 is set to the off-state; therefore, the potential of the connection point N1 between the p-channel transistor p2 and the n-channel transistor n2 becomes "H." Thereby, the p-channel transistor p4 is set to the off-state; the n-channel transistor n3 is set to the on-state; therefore, the potential of the connection point N2 is stable at "L." Subsequently, the control signal Vc2 returns to "L;" and the n-channel transistor n4 is set to the off-state.

Then, the sense amplifier 15 sets the data signal SA once to "H" and subsequently outputs the original data signal SA. Then, the n-channel transistor n1 is set to the on-state by setting the control signal Vc1 to "H;" and the value of the data signal SA is written to the data latch circuit 16.

In the case where the data signal SA is "H," the n-channel transistor n1 is in the on-state; therefore, the potential of the connection point N1 remains "H;" therefore, the potential of the connection point N2 is fixed at "L."

In the case where the data signal SA is "L," the n-channel transistor n1 is in the on-state; therefore, the potential of the connection point N1 becomes "L." Therefore, the p-channel transistor p4 is set to the on-state; and the n-channel transistor n3 is set to the off-state. Accordingly, the potential of the connection point N2 becomes "H." Thereby, the p-channel transistor p2 is set to the off-state; the n-channel transistor n2 is set to the on-state; therefore, the potential of the connection point N1 is fixed at "L."

Thus, in the case where the data signal SA is "H," the potential of the connection point N1 is fixed at "H," and the potential of the connection point N2 is fixed at "L;" and in the case where the data signal SA is "L," the potential of the connection point N1 is fixed at "L," and the potential of the connection point N2 is fixed at "H." As a result, the data latch circuit 116 can hold the value indicated by the data signal SA.

Effects of the embodiment will now be described.

In the embodiment, the data latch circuit 116 can be configured using six transistors. Thereby, compared to the first embodiment, the data latch circuit 116 can be downsized.

In the embodiment, both the gate of the n-channel transistor n2 and the gate of the p-channel transistor p2 are realized by one gate 152. Both the gate of the n-channel transistor n3 and the gate of the p-channel transistor p4 are realized by one gate 153. Thereby, the number of gates inside the data latch circuit 116 can be reduced; and the data latch circuit 116 can be downsized.

In the embodiment, the gate 151 and the gate 153 have band configurations extending in the X-direction and are arranged along the X-direction. The gate 152 and the gate 154 also have band configurations extending in the X-direction and are arranged along the X-direction. Thereby, there are two columns of gates in each of the data latch circuits 116; and the size in the Y-direction of the data latch circuit 116 can be reduced.

In the embodiment, the layouts of the data latch circuit 116 adjacent to each other in the X-direction are mirror images of each other. Thereby, between the data latch circuits 116 adjacent to each other in the X-direction, the gate 151 can be used commonly; and the gate 154 can be used commonly. Also, the layouts of the data latch circuit 116 adjacent to each other in the Y-direction are mirror images of each other. Thereby, between the data latch circuits 116 adjacent to each other in the Y-direction, the n-type layer 141, the n-type layer 143, the p-type layer 132, the p-type layer 133, the n-type layer 144, and the n-type layer 146 each can be used commonly. The data latch circuit 16 can be downsized thereby.

Otherwise, the configuration, the operations, and the effects of the embodiment are similar to those of the first embodiment described above.

Fourth Embodiment

A fourth embodiment will now be described.

Figure 14:
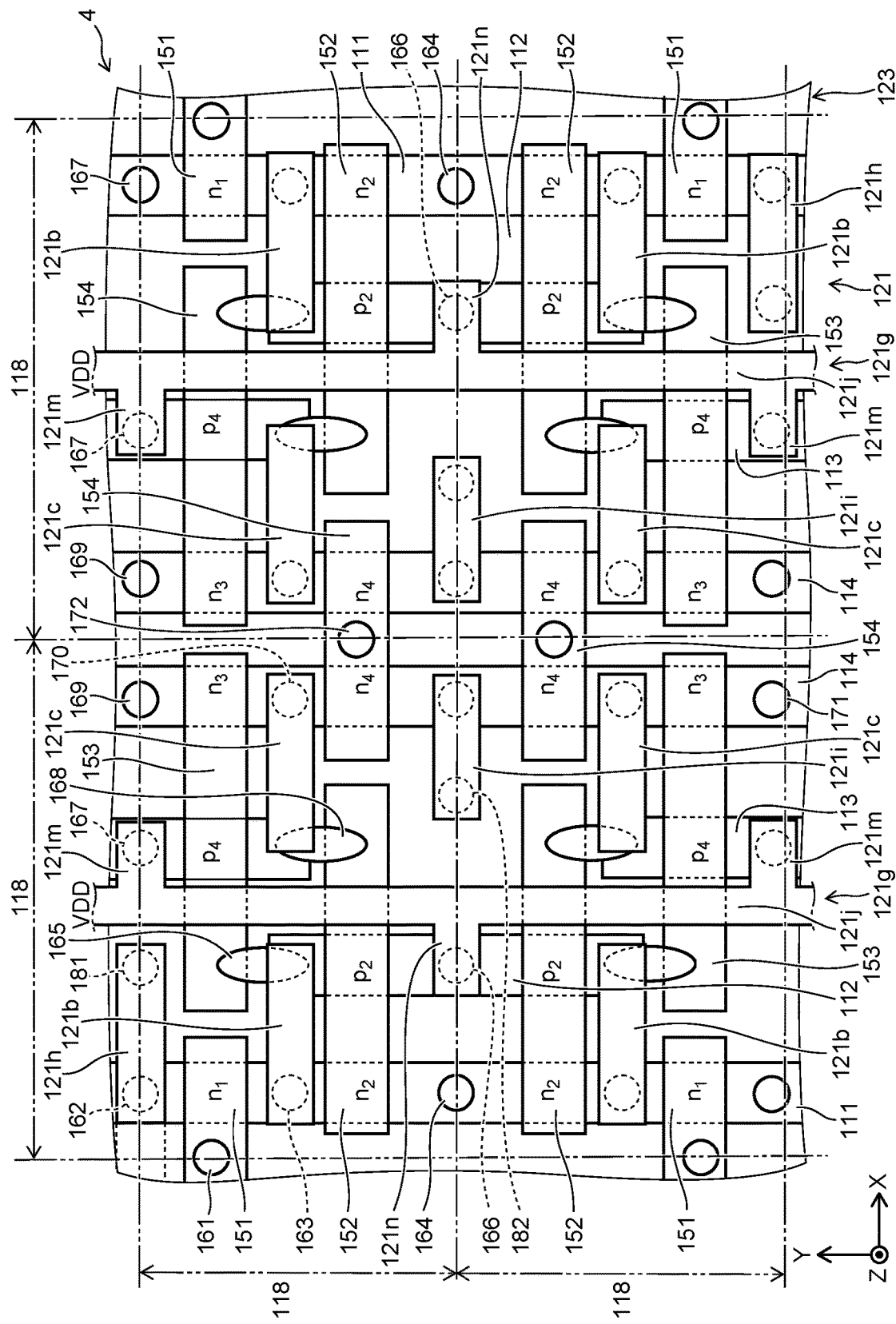
FIG. 14 is a plan view showing semiconductor regions, gates, contacts, and a first interconnect layer of four data latch circuits according to a fourth embodiment.

FIG. 14 is a plan view showing the semiconductor regions, the gates, the contacts, and the first interconnect layer of four data latch circuits according to the embodiment.

Figure 15:
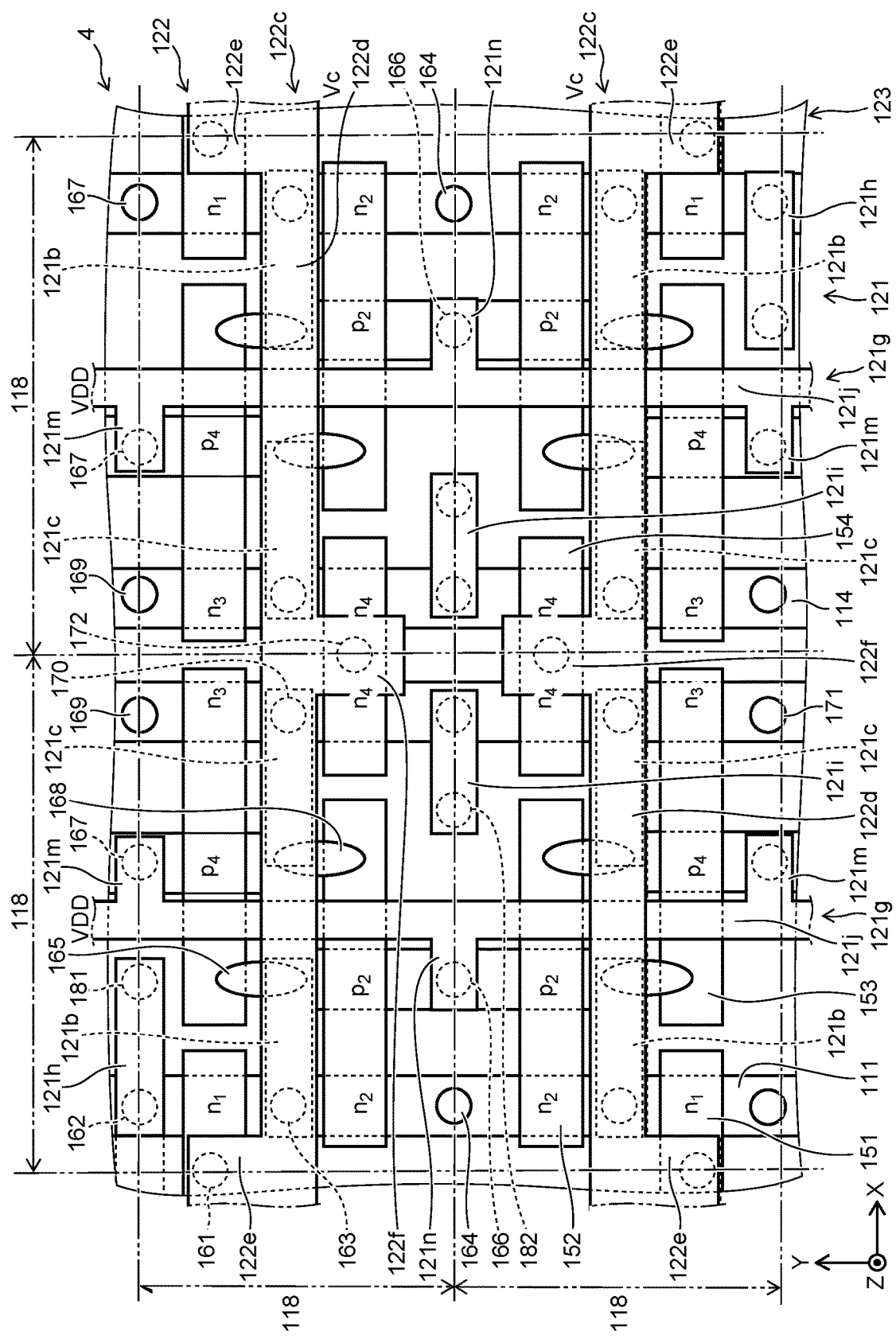
FIG. 15 is a plan view showing the semiconductor regions, the gates, the contacts, the first interconnect layer, and a second interconnect layer of the four data latch circuits according to the fourth embodiment.

FIG. 15 is a plan view showing the semiconductor regions, the gates, the contacts, the first interconnect layer, and the second interconnect layer of the four data latch circuits according to the embodiment.

Figure 16:
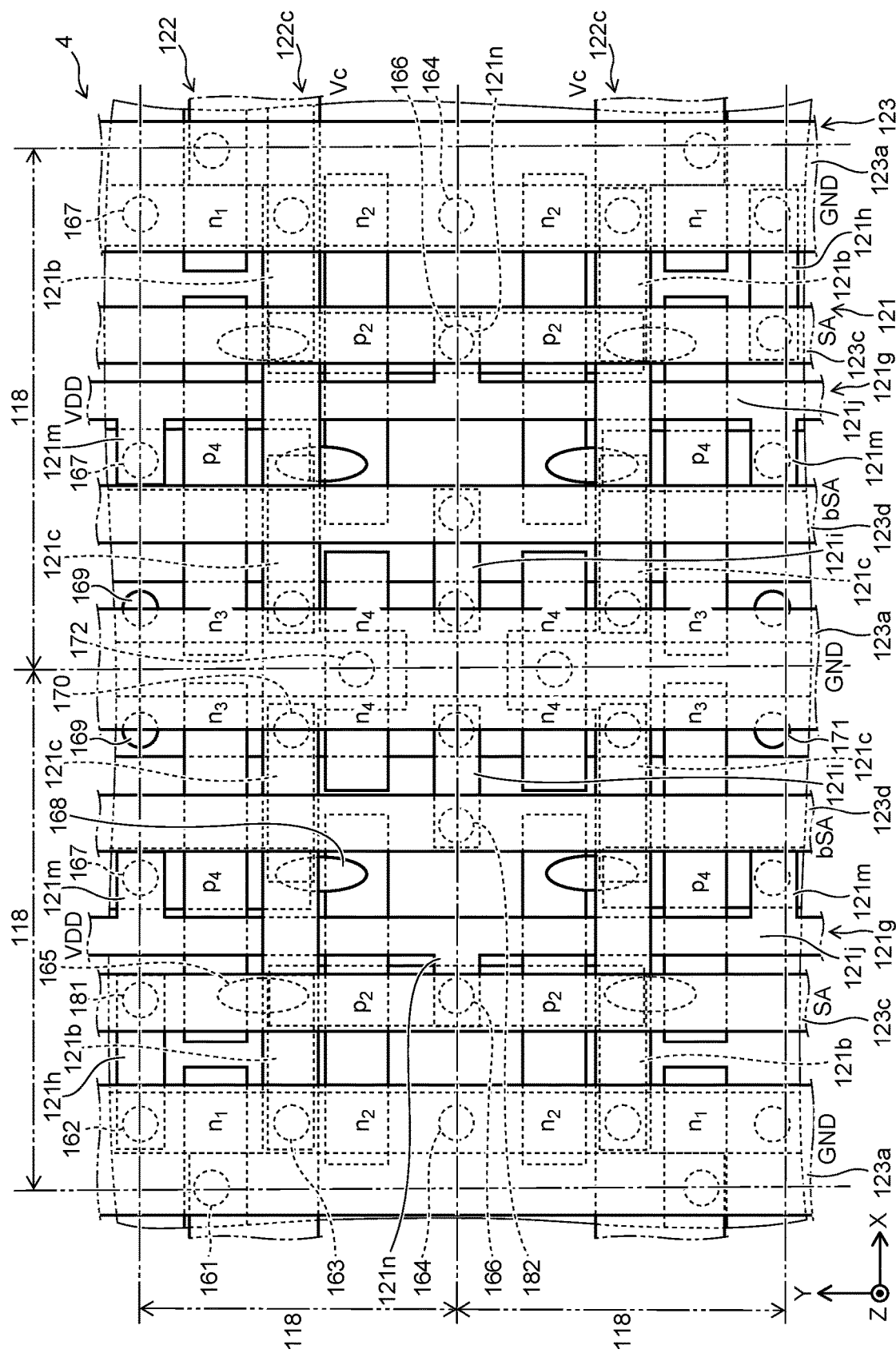
FIG. 16 is a plan view showing the semiconductor regions, the gates, the contacts, the first interconnect layer, the second interconnect layer, and a third interconnect layer of the four data latch circuits according to the fourth embodiment.

FIG. 16 is a plan view showing the semiconductor regions, the gates, the contacts, the first interconnect layer, the second interconnect layer, and the third interconnect layer of the four data latch circuits according to the embodiment.

Figure 17A:
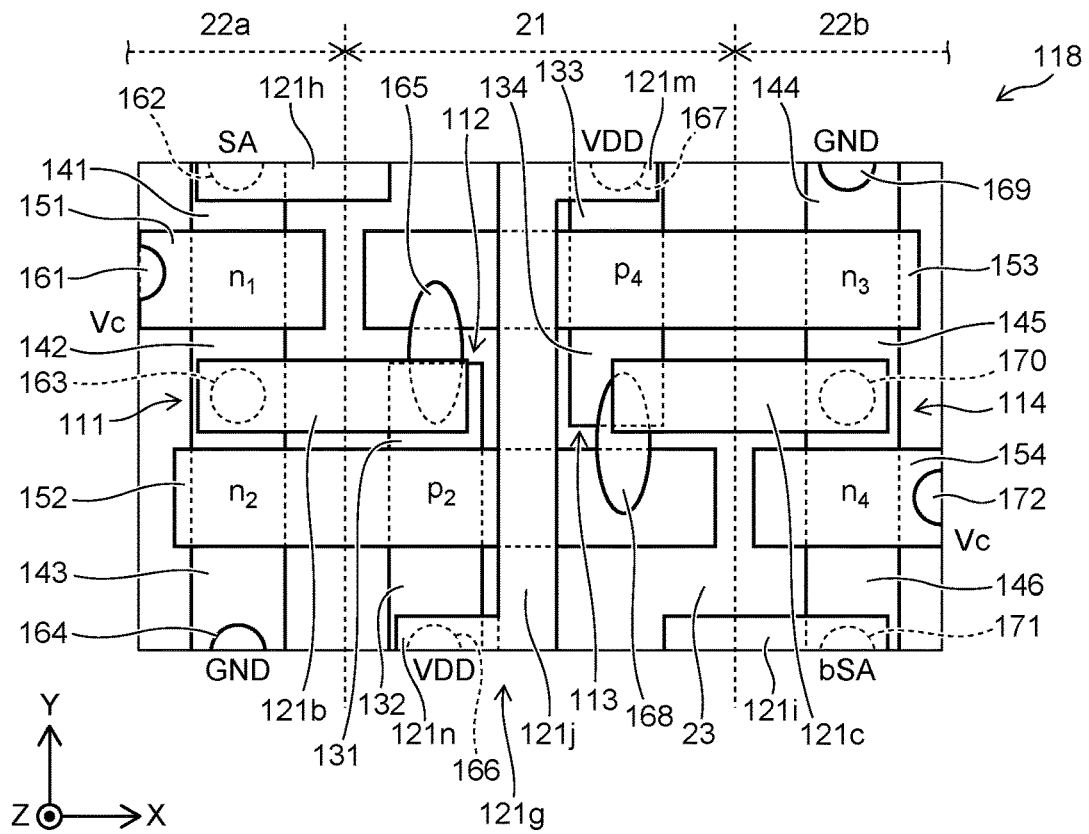
FIG. 17A is a plan view showing one data latch circuit according to the fourth embodiment.
Figure 17B:
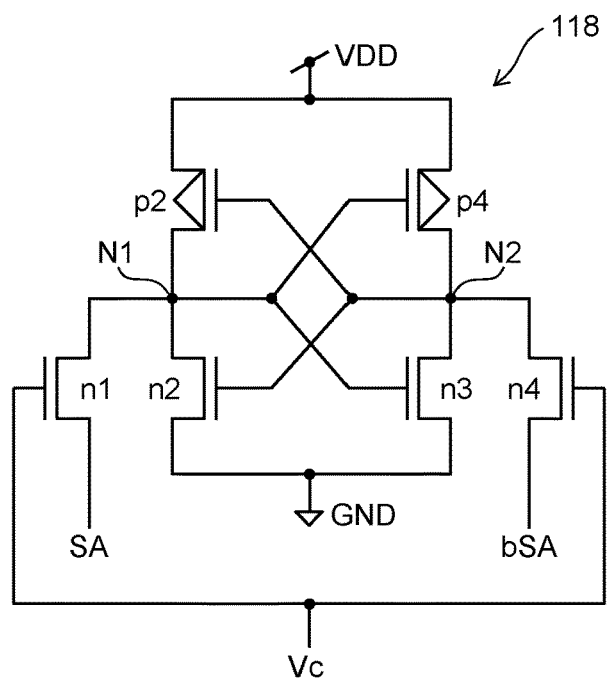
FIG. 17B is a circuit diagram of the one data latch circuit.

FIG. 17A is a plan view showing one data latch circuit according to the embodiment; and FIG. 17B is a circuit diagram of the one data latch circuit.

As shown in FIG. 14 to FIG. 16 and FIG. 17A, compared to the semiconductor memory device 3 according to the third embodiment described above (referring to FIG. 8 to FIG. 13B), the configuration of the data latch circuit 118 is different in the semiconductor memory device 4 according to the embodiment.

In the data latch circuit 118, the configurations, the positional relationships, and the connectional relationships of the n-well 21, the p-well 22, the p-type layers 131 to 134, the n-type layers 141 to 146, the gates 151 to 54, and the contacts 161 to 172 are similar to those of the data latch circuit 116 according to the third embodiment. On the other hand, compared to the data latch circuit 116, the configurations of the first interconnect layer 121, the second interconnect layer 122, and the third interconnect layer 123 are different in the data latch circuit 118. Also, vias 181 and 182 are provided in the data latch circuit 118.

First, the first interconnect layer 121 will be described.

As shown in FIG. 14 and FIG. 17A, the interconnect 121b, the interconnect 121c, an interconnect 121g, an interconnect 121h, and an interconnect 121i are provided in the first interconnect layer 121 of the data latch circuit 118. The positions and the configurations of the interconnect 121b and the interconnect 121c are similar to those of the third embodiment. The interconnect 121h is connected to the upper end of the contact 162 and the lower end of the via 181. The interconnect 121i is connected to the upper end of the contact 171 and the lower end of the via 182.

A trunk portion 121j and branch portions 121m and 121n are provided in the interconnect 121g. The trunk portion 121j of the interconnect 121g extends in the Y-direction through the X-direction central portion of each of the data latch circuits 118, that is, between the semiconductor region 112 and the semiconductor region 113. The trunk portion 121j is provided over the multiple data latch circuits 118 arranged along the Y-direction. The trunk portion 121j is disposed to pass through the region directly above the gate 152 and the region directly above the gate 153.

The branch portion 121m of the interconnect 121g extends toward one X-direction side from the trunk portion 121j and is connected to the upper end of the contact 167. The branch portion 121m is shared by two data latch circuits 118 adjacent to each other in the Y-direction. The branch portion 121n of the interconnect 121g extends toward the other X-direction side from the trunk portion 121j and is connected to the upper end of the contact 166. The branch portion 121n is shared by two data latch circuits 118 adjacent to each other in the Y-direction. Thus, the interconnect 121g is connected to the p-type layer 133 via the contact 167 and connected to the p-type layer 132 via the contact 166.

The second interconnect layer 122 will now be described.

As shown in FIG. 15, an interconnect 122c is provided in the second interconnect layer 122 of the data latch circuit 118. A trunk portion 122d and branch portions 122e and 122f are provided in the interconnect 122c. The trunk portion 122d of the interconnect 122c extends in the X-direction. The trunk portion 122d is provided over the multiple data latch circuits 118 arranged along the X-direction. The trunk portion 122d is disposed to pass through the region directly above the interconnect 121b and the region directly above the interconnect 121c of the first interconnect layer 121.

The branch portion 122e of the interconnect 122c extends toward one Y-direction side from the trunk portion 122d and is connected to the upper end of the contact 161. The branch portion 122f of the interconnect 122c extends toward the other Y-direction side from the trunk portion 122d and is connected to the upper end of the contact 172. Thus, the interconnect 122c is connected to the gate 151 via the contact 161 and connected to the gate 154 via the contact 172.

The third interconnect layer 123 will now be described.

As shown in FIG. 16, the interconnects 123a, 123c, and 123d are provided in the third interconnect layer 123 of the data latch circuit 118. The interconnects 123a, 123c, and 123d have line configurations extending in the Y-direction and are provided over the multiple data latch circuits 118 arranged along the Y-direction.

The positions and the configurations of the interconnect 123a are similar to those of the third embodiment. In other words, the interconnect 123a is disposed along the boundary line between the data latch circuits 118 adjacent to each other in the X-direction, belongs to, for example, two data latch circuits 118 adjacent to each other in the X-direction, and is disposed in the region directly above the semiconductor region 111 and the semiconductor region 114 adjacent to each other with the STI 23 interposed. The interconnect 123a is connected to the upper end of the contact 164 and the upper end of the contact 169. Thereby, the interconnect 123a is connected to the n-type layer 143 via the contact 164 and connected to the n-type layer 144 via the contact 169.

The interconnect 123c is disposed at the vicinity of the region directly above the semiconductor region 112 and is connected to the upper end of the via 181. Thereby, the interconnect 123c is connected to the n-type layer 141 by the via 181, the interconnect 121h, and the contact 162.

The interconnect 123d is disposed at the vicinity of the region directly above the portion between the semiconductor region 113 and the semiconductor region 114 and is connected to the upper end of the via 182. Thereby, the interconnect 123d is connected to the n-type layer 146 by the via 182, the interconnect 121i, and the contact 172.

As a result of electrically connecting the transistors as described above, the circuit shown in FIG. 17B is configured in each of the data latch circuits 118.

The connections between the transistors in the data latch circuit 118 are similar to those of the data latch circuit 116 according to the third embodiment. Also, the connection between the n-channel transistors n2 and n3 and the ground potential GND is similar to that of the data latch circuit 116.

On the other hand, the embodiment of how the power supply potential VDD, the control signal Vc, and the data signals SA and bSA are input to the transistors in the data latch circuit 118 is different from that of the data latch circuit 116. Also, the data latch circuit 118 differs from the data latch circuit 116 in that the control signal Vc is a common control signal, and the data signals SA and bSA are complementary signals. When one of the data signals SA and bSA is "H," the other is "L."

The other of the source or the drain of the p-channel transistor p2 (the p-type layer 132) is connected to the interconnect 121g via the contact 166 and the branch portion 121n. The other of the source or the drain of the p-channel transistor p4 (the p-type layer 133) is connected to the interconnect 121g via the contact 169 and the branch portion 121m. The power supply potential VDD is applied as the first reference potential to the interconnect 121g.

The gate 151 of the n-channel transistor n1 is connected to the interconnect 122c via the contact 161. The gate 154 of the n-channel transistor n4 is connected to the interconnect 122c via the contact 172. The common control signal Vc is applied to the interconnect 122c.

The other of the source or the drain of the n-channel transistor n1 (the n-type layer 141) is connected to the interconnect 123b via the contact 162, the interconnect 121h, and the via 181. The data signal SA is applied to the interconnect 123b.

The other of the source or the drain of the n-channel transistor n1 (the n-type layer 146) is connected to the interconnect 123c via the contact 171, the interconnect 121i, and the via 182. The data signal bSA is applied to the interconnect 123c.

Operations of the semiconductor memory device according to the embodiment will now be described.

In the initial state as shown in FIG. 17B, the control signal Vc and the data signal SA each are "L." Therefore, the n-channel transistors n1 and n4 is in the off-state. From this state, in the data latch circuit 118 caused to hold the data, the control signal Vc is set to "H;" and the n-channel transistors n1 and n4 are set to the on-state. Then, the sense amplifier 15 outputs the data signals SA and bSA to the data latch circuit 118. The method for holding the data by the n-channel transistors n2 and n3 and the p-channel transistors p2 and p4 is similar to that of the third embodiment.

According to the embodiment as well, effects similar to those of the third embodiment can be obtained.

According to the embodiments described above, a data latch circuit and a semiconductor memory device in which downsizing is possible can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data latch circuit, comprising:
a first semiconductor substrate;
a first p-well provided on the first semiconductor substrate;
a second p-well provided on the first semiconductor substrate and separated from the first p-well in a first direction;
an n-well provided on the first semiconductor substrate and disposed between the first p-well and the second p-well;
first to third n-type layers provided on the first p-well and arranged along a second direction crossing the first direction;
fourth to sixth n-type layers provided on the second p-well and arranged along the second direction;
first and second p-type layers provided on the n-well and arranged along the second direction;
third and fourth p-type layers provided on the n-well and arranged along the second direction;
a first gate provided in a region directly above a portion of the first p-well between the first n-type layer and the second n-type layer;
a second gate provided in a region directly above a portion of the first p-well between the second n-type layer and the third n-type layer and in a region directly above a portion of the n-well between the first p-type layer and the second p-type layer;
a third gate provided in a region directly above a portion of the n-well between the third p-type layer and the fourth p-type layer and in a region directly above a portion of the second p-well between the fourth n-type layer and the fifth n-type layer; and
a fourth gate provided in a region directly above a portion of the second p-well between the fifth n-type layer and the sixth n-type layer.

2. The circuit according to claim 1, further comprising an insulating layer,
the insulating layer being provided between a first semiconductor region, a second semiconductor region, a third semiconductor region, and a fourth semiconductor region,
the first semiconductor region including the first n-type layer, the portion of the first p-well between the first n-type layer and the second n-type layer, the second n-type layer, the portion of the first p-well between the second n-type layer and the third n-type layer, and the third n-type layer, the second semiconductor region including the first p-type layer, the portion of the n-well between the first p-type layer and the second p-type layer, and the second p-type layer, the third semiconductor region including the third p-type layer, the portion of the n-well between the third p-type layer and the fourth p-type layer, and the fourth p-type layer, the fourth semiconductor region including the fourth n-type layer, the portion of the second p-well between the fourth n-type layer and the fifth n-type layer, the fifth n-type layer, the portion of the second p-well between the fifth n-type layer and the sixth n-type layer, and the sixth n-type layer.

3. The circuit according to claim 2, wherein the second semiconductor region is disposed between the first semiconductor region and the third semiconductor region, the second gate is connected to the fourth p-type layer and the fifth n-type layer, and the third gate is connected to the second n-type layer and the first p-type layer.

4. The circuit according to claim 1, wherein the second gate and the third gate have band configurations extending in the first direction.

5. The circuit according to claim 1, wherein the first n-type layer is connected to the sixth n-type layer.

6. The circuit according to claim 1, wherein the second p-type layer is connected to the third p-type layer.

7. A semiconductor memory device, comprising:
a plurality of the data latch circuits according to claim 1; and
a sense amplifier,
the plurality of data latch circuits being arranged in a matrix configuration along the first direction and the second direction,
the first p-well, the n-well, the second p-well, the first semiconductor region, and the fourth semiconductor region extending in the second direction,
layouts of the data latch circuits adjacent to each other in the first direction being mirror images of each other,
layouts of the data latch circuits adjacent to each other along the second direction being mirror images of each other,
the first gates being a common gate between the data latch circuits adjacent to each other in the first direction,
the fourth gates being a common gate between the data latch circuits adjacent to each other in the first direction,
between the data latches adjacent to each other in the second direction, the first n-type layers being a common layer, the fourth n-type layers being a common layer, and the third p-type layers being a common layer,
between the data latches adjacent to each other in the second direction, the third n-type layers being a common layer, the sixth n-type layers being a common layer, and the second p-type layers being a common layer.

8. The device according to claim 7, wherein
a first reference potential is applied to the second p-type layer and the third p-type layer,
a second reference potential lower than the first reference potential is applied to the third n-type layer and the fourth n-type layer, and
the first n-type layer and the sixth n-type layer are connected to the sense amplifier.

9. The device according to claim 7, further comprising:
a source line;
a plurality of electrode films provided on the source line and stacked to be separated from each other;
a semiconductor member piercing the plurality of electrode films and being connected to the source line;
a charge storage member provided between the semiconductor member and the electrode films; and
a bit line provided on the plurality of electrode films and connected to the semiconductor member,
the bit line being connectable to the sense amplifier.

10. The device according to claim 9, further comprising a second semiconductor substrate bonded to the first semiconductor substrate,
the source line, the plurality of electrode films, the semiconductor member, the charge storage member, and the bit line being provided on the second semiconductor substrate.

* * * * *